(12) United States Patent
Oku

(10) Patent No.: US 8,307,262 B2
(45) Date of Patent: *Nov. 6, 2012

(54) DATA READ-OUT CIRCUIT IN SEMICONDUCTOR MEMORY DEVICE AND METHOD OF DATA READING IN SEMICONDUCTOR MEMORY DEVICE

(75) Inventor: Satoru Oku, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/306,229

(22) Filed: Nov. 29, 2011

(65) Prior Publication Data

US 2012/0072804 A1    Mar. 22, 2012

Related U.S. Application Data

(63) Continuation of application No. 11/834,426, filed on Aug. 6, 2007, now Pat. No. 8,091,008.

(30) Foreign Application Priority Data

Aug. 23, 2006   (JP) ................................. 2006-226502

(51) Int. Cl.
*G11C 29/00* (2006.01)
(52) U.S. Cl. ...................................................... 714/766
(58) Field of Classification Search .................. 714/763, 714/766, 773; 365/189.05, 185.03
See application file for complete search history.

(56) References Cited

U.S. PATENT DOCUMENTS

| 5,263,031 | A | 11/1993 | Inoue |
| 5,293,560 | A | 3/1994 | Harari |
| 5,351,210 | A | 9/1994 | Saito |
| 5,778,012 | A | 7/1998 | Branchetti et al. |
| 5,864,569 | A | 1/1999 | Roohparvar |
| 5,905,673 | A | 5/1999 | Khan |
| 6,525,963 | B2 | 2/2003 | Kern et al. |
| 7,187,585 | B2 | 3/2007 | Li et al. |
| 2003/0169622 | A1 | 9/2003 | Ooishi et al. |

FOREIGN PATENT DOCUMENTS

| JP | 2001-202788 A | 7/2001 |
| JP | 2003-257192 A | 9/2003 |
| JP | 2005-209304 A | 8/2005 |

OTHER PUBLICATIONS

Japanese Office Action issued in corresponding Japanese Application No. 2006-226502 on Oct. 3, 2011.
Japanese Office Action issued in Japanese Application No. 2006-226502 dated Mar. 8, 2012 (with translation) (6 pages).

*Primary Examiner* — Shelly A Chase
(74) *Attorney, Agent, or Firm* — Sughrue Mion, PLLC

(57) ABSTRACT

A data read-out circuit is provided with a sense amplifier circuit and a selector. The sense amplifier circuit senses a stored data stored in a memory cell array by using a plurality of reference levels to generate a plurality of read data, respectively. Thus, the sense amplifier circuit outputs the plurality of read data with regard to the stored data. The selector selects a data corresponding to any one of the plurality of read data based on a control signal and outputs the selected data as an output data.

14 Claims, 16 Drawing Sheets

Fig. 10

|   | SE1 | SE2 | OUTPUT DATA |
|---|-----|-----|-------------|
| 1 | 00  | 00  | DE1         |
| 2 | 00  | 01  | DE1         |
| 3 | 00  | 10  | DE1         |
| 4 | 01  | 00  | DE2         |
| 5 | 01  | 01  | DE1         |
| 6 | 01  | 10  | DE1         |
| 7 | 10  | 00  | DE2         |
| 8 | 10  | 01  | DE2         |
| 9 | 10  | 10  | (ERROR SIGNAL ERR) |

US 8,307,262 B2

DATA READ-OUT CIRCUIT IN SEMICONDUCTOR MEMORY DEVICE AND METHOD OF DATA READING IN SEMICONDUCTOR MEMORY DEVICE

This application is a Continuation of application Ser. No. 11/834,426 filed Aug. 6, 2007, which is based on Japanese Patent Application No. 2006-226502 filed on Aug. 23, 2006, the disclosure of which is incorporated herein by reference in its entirety.

BACKGROUND OF THE INVENTION

1. Field of the Invention

The present invention relates to techniques of data reading in a semiconductor memory device.

2. Description of Related Art

Semiconductor memory devices such as a DRAM (Dynamic Random Access Memory), an EEPROM (Electrically Erasable and Programmable Read Only Memory), a flash memory and the like are known. In general, at the time of data reading in such a semiconductor memory device, a read-out level read out from a memory cell is compared with a predetermined reference level and thereby a data stored in the memory cell is judged (determined).

Japanese Laid-Open Patent Application JP-P2005-209304A describes a technique in which data is judged by using a first reference potential and a second reference potential. According to the technique, the settings of the first reference potential and the second reference potential are designed to improve data-judgment precision in a sense amplifier circuit. The sense amplifier circuit includes: a first sense amplifier that performs the sense operation by comparing a data potential read out from a memory cell with the first reference potential; and a second sense amplifier that performs the sense operation by comparing the data potential with the second reference potential. The data judgment ("0" or "1") is achieved by the collaboration of the first sense amplifier and the second sense amplifier. Then, one kind of read data corresponding to a result of the data judgment is output from the sense amplifier circuit.

The inventor of the present application has recognized the following points with regard to the semiconductor memory device.

After a data is programmed to a memory cell, there is a possibility that the data stored in the memory cell varies in time. In a case of an EEPROM, for example, a threshold voltage of a memory cell transistor can vary due to electrons coming into and leaking from a floating gate. This leads to variation in the stored data (so-called "data dissipation" or "data corruption"). The variation in the stored data causes malfunction of a microcomputer provided with the semiconductor memory device.

As a countermeasure against the data dissipation, an ECC (Error Correction Code) circuit may be employed. The ECC circuit is capable of detecting a certain number of error bits in a data read out from memory cells and correcting some of the error bits. However, if there exist error bits more than the correctable number of bits in the read-out data, even the ECC circuit cannot correct the read-out data. In this case, the malfunction of the microcomputer still occurs and thus the microcomputer fails. Even when the ECC circuit is applied to the semiconductor memory device described in the above-mentioned patent document, the result is the same. If there exist error bits more than the correctable number of bits in the one kind of read data output from the sense amplifier circuit, the correction of the read data is no longer possible.

A technique that can reduce the malfunction of microcomputer caused by the data dissipation is desired.

SUMMARY

In one embodiment of the present invention, a data read-out circuit is provided. The data read-out circuit is provided with a sense amplifier circuit and a selector. The sense amplifier circuit senses a stored data stored in a memory cell array by using a plurality of reference levels to generate a plurality of read data, respectively. Thus, the sense amplifier circuit outputs the plurality of read data with regard to the stored data. The selector selects a data corresponding to any one of the plurality of read data based on a control signal and outputs the selected data as an output data.

As described above, the plurality kinds of read data are generated with regard to the same stored data. Even if a bit error exists in a read data obtained by using a certain reference level, the bit error may not appear in another read data obtained by using another reference level. Since the plurality kinds of read data are output from the sense amplifier circuit, the selector can select the most preferable one from the plurality kinds of read data. Therefore, reliability of the output data output from a semiconductor memory device provided with the read-out circuit is improved. Since the reliability of the output data is improved, malfunction of a device provided with the semiconductor memory device is reduced.

The above-mentioned control signal indicates, for example, respective numbers of error bits in the plurality of read data which are detected by an ECC (Error Correction Code) circuit. The selector can select a data corresponding to one of the plurality of read data having the minimum number of error bits, as the most preferable output data. For example, let us consider a case where one error bit exists in a read data obtained by using a certain reference level, while two error bits exist in another read data obtained by using another reference level. In this case, the read data including the one error bit is correctable by the ECC circuit. Therefore, the selector can output the post-correction-processing data as the most preferable output data. As a result, the malfunction of the device provided with the semiconductor memory device is prevented, and it is thus not necessary to stop the device.

In another embodiment of the present invention, a correction circuit is provided. The correction circuit is provided with an ECC circuit and a selector. The ECC circuit receives a plurality of read data that are read out from the same memory cell group. Then, the ECC circuit detects respective numbers of error bits in the plurality of read data by using an error correction code associated with a stored data stored in the above-mentioned same memory cell group. The selector selects a data corresponding to one of the plurality of read data having the minimum number of error bits.

In still another embodiment of the present invention, a method of data reading in a semiconductor memory device is provided. The method includes: (A) sensing a stored data stored in a memory cell array by using a plurality of reference levels to respectively generate a plurality of read data with regard to the stored data; and (B) selecting a data corresponding to any one of the plurality of read data and outputting the selected data as an output data.

According to the present invention, the reliability of the output data output from the data read-out circuit in the semiconductor memory device is improved. Since the reliability of the output data is improved, malfunction of a device provided with the semiconductor memory device is reduced.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 10 is a table showing a logic of a selector in the third embodiment;

DETAILED DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

A semiconductor memory device according to embodiments of the present invention will be described below with reference to the attached drawings. The semiconductor memory device according to the embodiments is installed in a microcomputer, for example.

1. First Embodiment 1-1. Configuration and Operation

Figure 1:
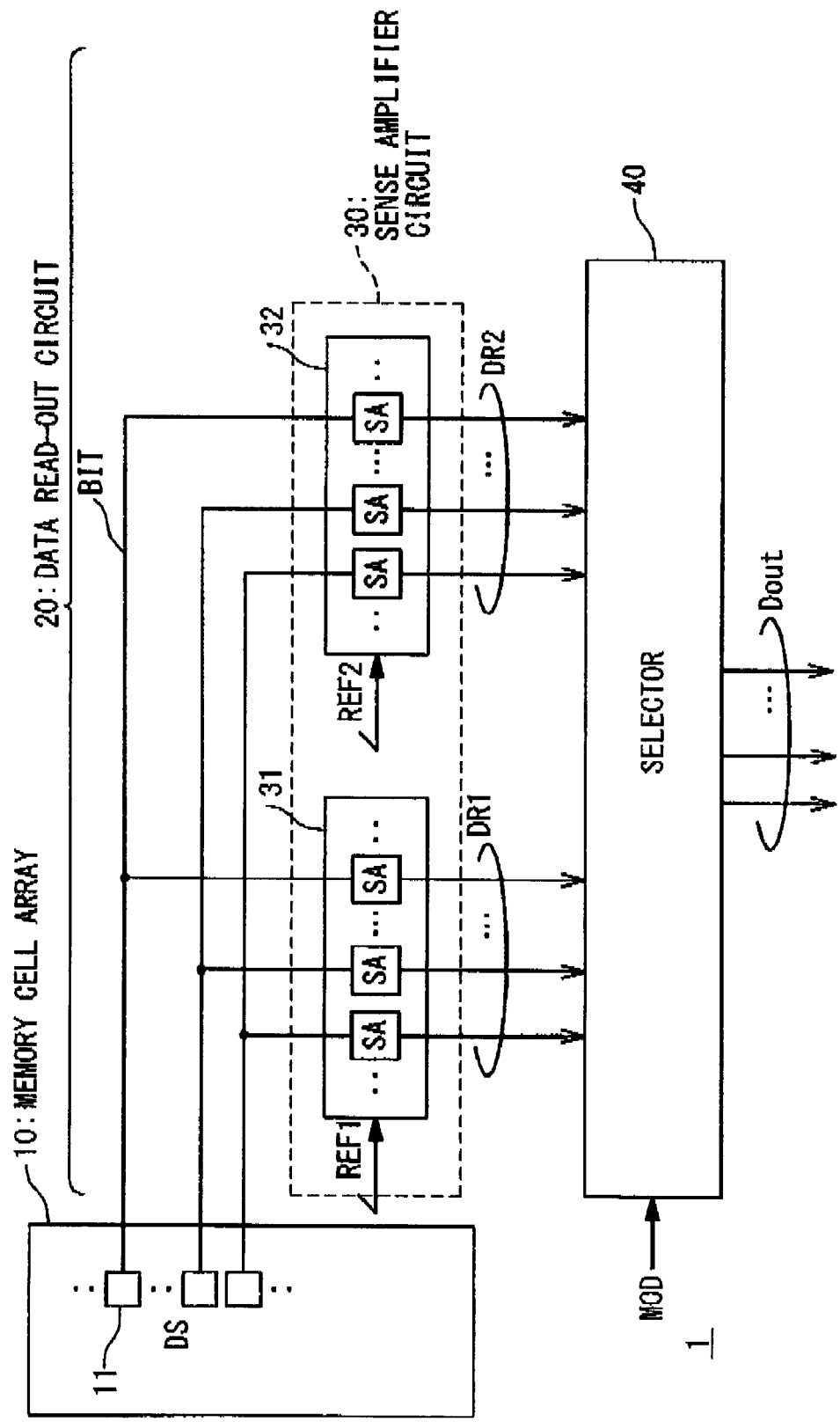
FIG. 1 is a block diagram schematically showing a configuration of a semiconductor memory device according to a first embodiment of the present invention.

FIG. 1 schematically shows a configuration of a semiconductor memory device 1 according to the first embodiment. The semiconductor memory device 1 is provided with a memory cell array 10 and a data read-out circuit 20. The memory cell array 10 has a plurality of memory cells 11 arranged in an array form. Data stored in the memory cells 11 of the memory cell array 10 is hereinafter referred to as "stored data DS".

The data read-out circuit 20 reads out the stored data DS from the memory cell array 10 and outputs the read data as an output data Dout. In the present embodiment, the data read-out circuit 20 includes: a sense amplifier circuit 30 connected to the memory cell array 10; and a selector 40 connected to the sense amplifier circuit 30.

The sense amplifier circuit 30 reads out the stored data DS from the memory cell array 10 and outputs the read data to the selector 40. More specifically, the sense amplifier circuit 30 of the present embodiment can output two kinds of read data DR1 and DR2 with regard to the same (identical) stored data DS stored in the same memory cell group in the memory cell array 10.

For example, as shown in FIG. 1, the sense amplifier circuit 30 includes a first sense amplifier circuit 31 and a second sense amplifier circuit 32. The first sense amplifier circuit 31 has a plurality of sense amplifiers SA, and the plurality of sense amplifiers SA are connected to a plurality of memory cells 11 through a plurality of bit lines BIT, respectively. Similarly, the second sense amplifier circuit 32 has a plurality of sense amplifiers SA, and the plurality of sense amplifiers SA are connected to the plurality of memory cells 11 through the plurality of bit lines BIT, respectively. That is, the sense amplifier circuits 31, 32 are connected in parallel to the memory cell array 10. Thus, one memory cell 11 is connected to both of the sense amplifier circuits 31 and 32. By using those two sense amplifier circuits 31 and 32, the two kinds of read data DR1, DR2 can be obtained from the same memory cell group.

More specifically, the first sense amplifier circuit 31 is configured to sense (detect) the stored data DS by using a first reference level REF1. Then, the first sense amplifier circuit 31 outputs the sensed data as the first read data DR1 to the selector 40. On the other hand, the second sense amplifier circuit 32 is configured to sense the same stored data DS by using a second reference level REF2 that is different from the first reference level REF1. Then, the second sense amplifier circuit 32 outputs the sensed data as the second read data DR2 to the selector 40.

Let us consider a case where the stored data DS of 8 bits is read out, as an example. In this case, the stored data DS is stored in eight memory cells 11 (hereinafter referred to as a "target memory cell group") in the memory cell array 10. Eight sense amplifiers SA in the first sense amplifier circuit 31 connected to the target memory cell group sense the stored data DS in reference to the first reference level REF1 and then output the sensed data as the first read data DR1. At the same time, eight sense amplifiers SA in the second sense amplifier circuit 32 connected to the same target memory cell group sense the stored data DS in reference to the second reference level REF2 and then output the sensed data as the second read data DR2.

In this manner, the sense amplifier circuit 30 according to the present embodiment generates the first read data DR1 and the second read data DR2 with regard to the same stored data DS, by using the different reference levels REF1 and REF2, respectively. Then, the sense amplifier circuit 30 outputs the two kinds of read data (DR1, DR2) to the selector 40 in parallel.

It should be noted that the above-mentioned "reference level" means a reference current or a reference potential. In a case when the reference current is used, the sense amplifier SA can sense a data (bit) stored in the connected memory cell 11 by comparing a current flowing through the connected bit line BIT and the reference current. In a case when the reference potential is used, the sense amplifier SA can sense a data (bit) stored in the connected memory cell 11 by comparing a potential of the connected bit line BIT and the reference potential. The details of the reference level will be described later in Section. 5.

The selector 40 receives the two kinds of read data (DR1, DR2) from the sense amplifier circuit 30. Moreover, the selector 40 receives a mode signal MOD input from the outside of the semiconductor memory device 1. The mode signal MOD is a signal indicating an operation mode of the semiconductor memory device 1. The selector 40 selects any one of the first read data DR1 and the second read data DR2 in accordance with the mode signal MOD, and outputs the selected one as the output data Dout to a bus.

For example, in a case when the mode signal MOD is at High level, the selector 40 selects the first read data DR1. On the other hand, in a case when the mode signal MOD is at Low level, the selector 40 selects the second read data DR2. It can be said that the mode signal MOD is a "control signal" for specifying the operation of the selector 40. In order to explain an example of the setting of the mode signal MOD, a case where the present embodiment is applied to an EEPROM (Electrically Erasable and Programmable Read Only Memory) will be described below in detail.

1-2. Speed Margin, DC Margin

As an example, the case where the present embodiment is applied to an EEPROM is considered. In this case, the memory cell 11 is constituted by a MOS transistor having a control gate and a floating gate. The memory cell 11 (MOS transistor) is hereinafter referred to as a "memory cell transistor". The threshold voltage Vt of the memory cell transistor 11 varies depending on the amount of charges in the floating gate. Discrimination between the data "0" and "1" is possible on the basis of high-low of the threshold voltage Vt.

Figure 2:
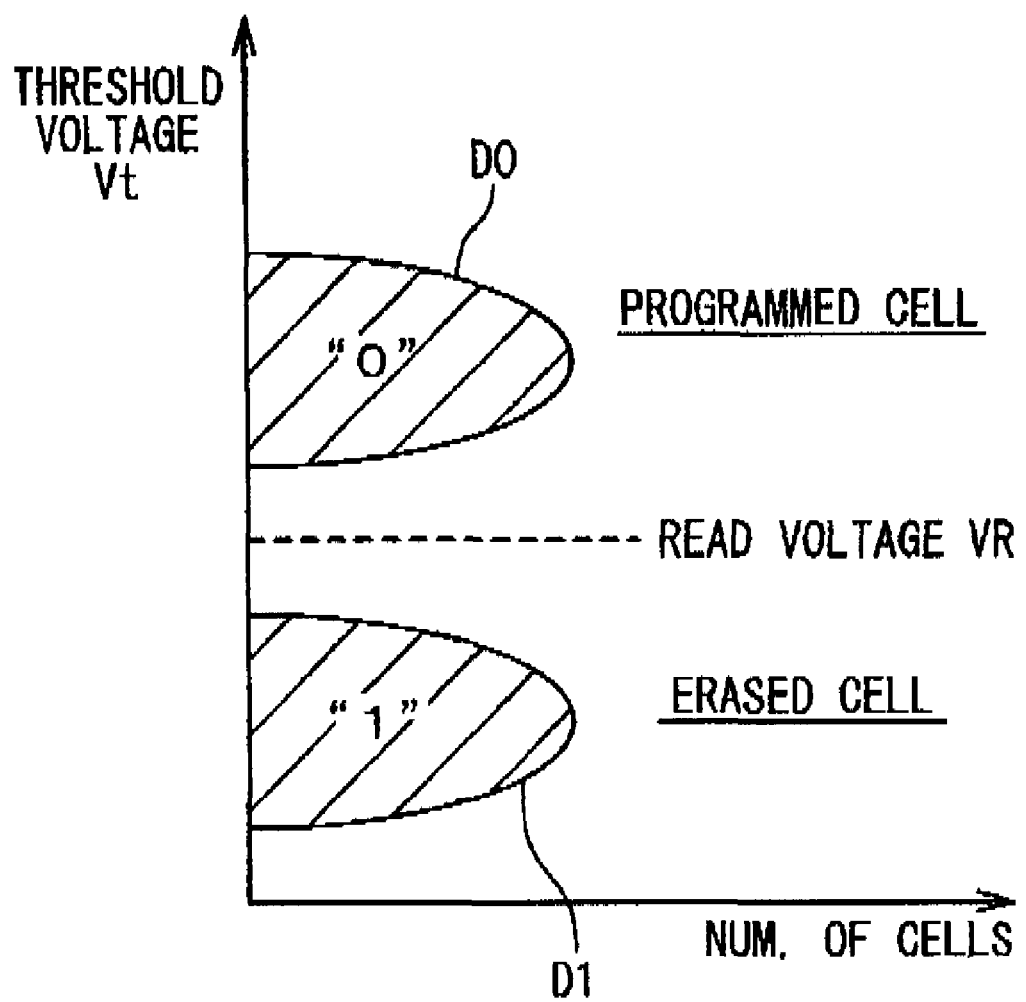
FIG. 2 is a graph showing a distribution of threshold voltage of memory cells in an EEPROM.

FIG. 2 is a graph conceptually showing a distribution of the threshold voltage Vt in the EEPROM. The vertical axis and the horizontal axis represent the threshold voltage Vt and the number of cells, respectively. In FIG. 2, the memory cell transistor 11 having the higher threshold voltage Vt (hereinafter referred to as a "programmed cell") is related to the data "0". The distribution of the programmed cells is represented by distribution D0. On the other hand, the memory cell transistor 11 having the lower threshold voltage Vt (hereinafter referred to as an "erased cell") is related to the data "1". The distribution of the erased cells is represented by distribution D1.

At the time of data programming, electrons are injected into the floating gate such that the threshold voltage Vt of the target memory cell becomes higher than a predetermined program level. In other words, electron injection is performed such that the target memory cell becomes included in the distribution D0. On the other hand, at the time of data erasing, electrons are drawn out of the floating gate such that the threshold voltage Vt of the target memory cell becomes lower than a predetermined erase level. In other words, electron drawing-out is performed such that the target memory cell becomes included in the distribution D1.

At the time of data reading, a read voltage VR is applied to the control gate of the memory cell transistor 11 that is the target of the data read. The read voltage VR is set to be higher than the distribution D1 and lower than the distribution D0. Thus, at the time of data reading, a cell current flows from the erased cell, while a cell current hardly flows from the programmed cell. By comparing the cell current with a predetermined reference current, it is possible to judge whether the read target memory cell is the erased cell or the programmed cell. That is to say, it is possible to judge whether the data stored in the target memory cell is "0" or "1" in accordance with the current sense method using the predetermined reference current.

Figure 3:
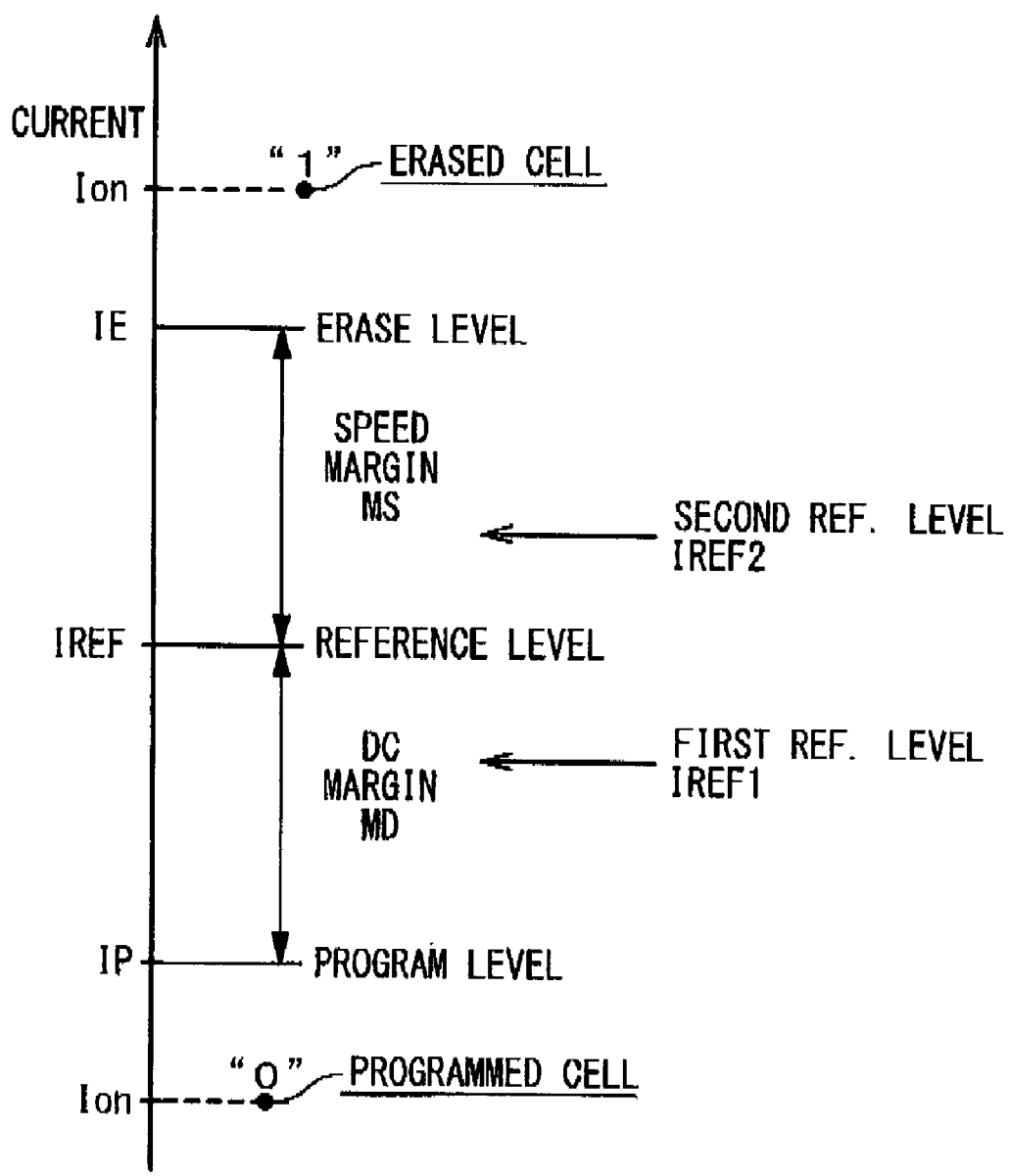
FIG. 3 is a conceptual diagram for explaining data reading in the EEPROM.

FIG. 3 is a diagram for explaining conditions that are imposed on the reference current used in the data reading, and the vertical axis indicates current. As shown in FIG. 3, the cell current Ion that can flow through the erased cell is larger than a predetermined erase level IE. In other words, at the time of data erasing, the electron drawing-out is performed such that the cell current Ion which can flow through the target memory cell becomes larger than the erase level IE. Also, the cell current Ion that can flow through the programmed cell is smaller than a predetermined program level IP. In other words, at the time of data programming, the electron injection is performed such that the cell current Ion which can flow through the target memory cell becomes smaller than the program level IP.

First, let us consider a general case where one kind of reference current IREF is used as the reference level at the time of data reading. The reference current IREF is set at a level between the erase level IE and the program level IP. Here, predetermined margins MS and MD are required between the erase level IE and the reference current IREF and between the program level IP and the reference current IREF, respectively.

The reason why the predetermined margin MS is necessary between the erase level IE and the reference current IREF will be explained below with reference to FIG. 4. As described above, the cell current Ion easily flows through the erased cell. By detecting that the cell current Ion is larger than the reference current IREF, the sense amplifier SA can detect the data "1". What should be noted here is that the cell current Ion does not rise instantaneously but increases gradually from a time t0 when the read operation is started. The increasing rate of the cell current Ion becomes higher as the cell current Ion (maximum) under the stable state after the transition state is larger, namely, as the threshold voltage Vt is lower.

Figure 4:
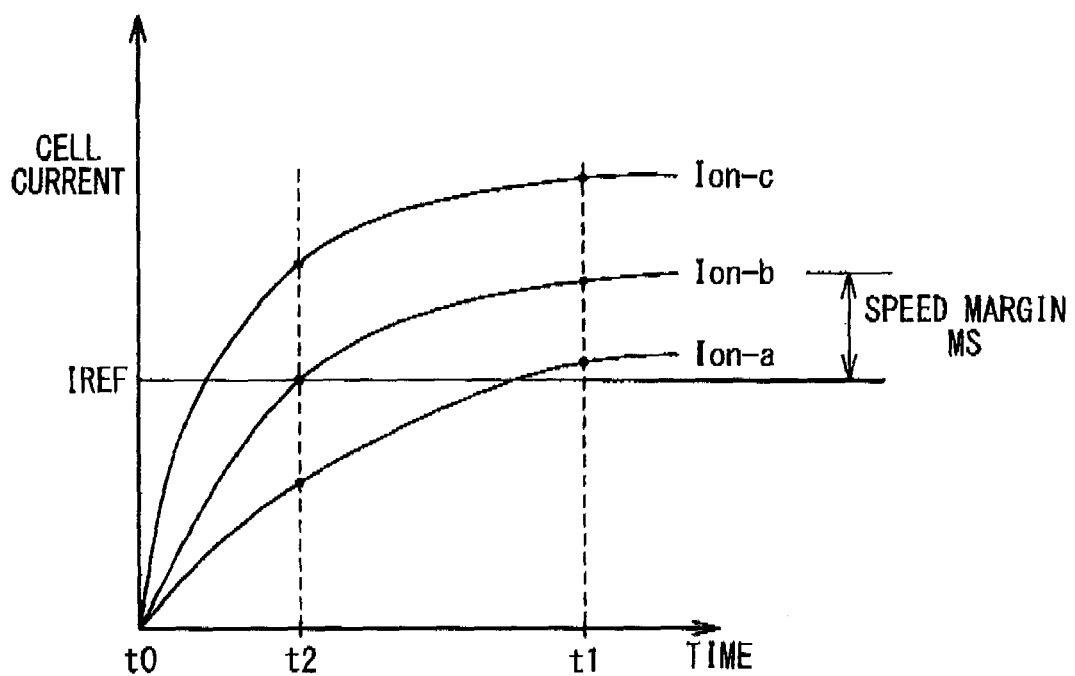
FIG. 4 is a graph for explaining a speed margin.

For example, FIG. 4 shows various patterns (Ion-a, Ion-b and Ion-c) of time variation of the cell current flowing through the erased cell. In a case where the erasing is performed relatively strongly, the threshold voltage Vt of the erased cell becomes relatively low. As a result, the increasing rate of the cell current becomes relatively high, as represented by "Ion-c" in FIG. 4. To the contrary, in a case where the erasing is performed relatively weakly, the threshold voltage Vt of the erased cell becomes relatively high. As a result, the increasing rate of the cell current becomes relatively low, as represented by "Ion-a" in FIG. 4.

At a time t1, all of the cell currents Ion-a, Ion-b and Ion-c are larger than the reference current IREF. Therefore, the data "1" can be correctly sensed in every patterns (Ion-a, Ion-b, Ion-c), if the timing of data judgment is the time t1. However, in a case where the timing of data judgment is a time t2, the cell current Ion-a does not yet become larger than the reference current IREF. Therefore, the data stored in the erased cell through which the cell current Ion-a flows is erroneously judged to be "0".

The timing of data judgment is different depending on a required data read speed. The magnitude of the cell current Ion at the stable state (the maximum value of the cell current Ion), namely, the threshold voltage Vt of the erased cell should be set such that the cell current Ion (momentary value) exceeds the reference current IREF by the required timing. In the case where the timing of data judgment is the time t2, for example, the threshold voltage Vt should be set such that the cell current at the stable state becomes larger than at least the Ion-b. A difference between the limit value Ion-b of the cell current and the reference current IREF is the margin to be set between the erase level IE and the reference current IREF, and is referred to as a "speed margin MS" hereinafter.

As shown in FIG. 3, the speed margin MS depending on the required data read speed is set between the erase level IE and the reference current IREF. As the required data read speed becomes higher, the speed margin MS to be set becomes wider. By providing the above-explained speed margin MS, the erroneous data judgment due to the lack of read time can be prevented.

Figure 5:
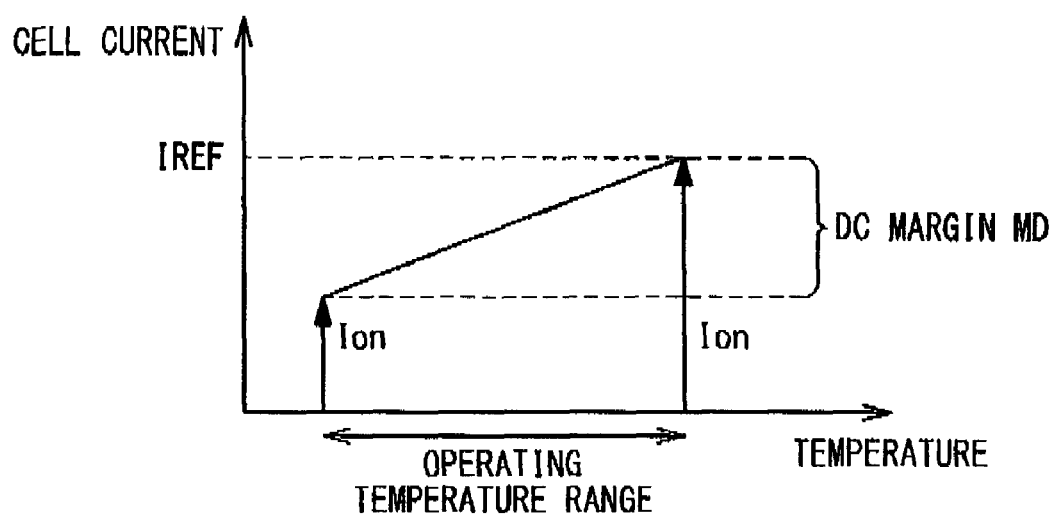
FIG. 5 is a graph for explaining a DC margin.

The reason why the predetermined margin MD is necessary between the program level IP and the reference current IREF will be explained below with reference to FIG. 5. As described above, the cell current Ion hardly flows through the programmed cell. By detecting that the cell current Ion is smaller than the reference current IREF, the sense amplifier SA can detect the data "0". What should be noted here is that the magnitude of the cell current Ion depends on temperature. The reason is that the threshold voltage Vt of the memory cell transistor 11 depends on the temperature. It is known that the threshold voltage Vt tends to decrease as the temperature becomes higher. Therefore, as shown in FIG. 5, the cell current Ion becomes larger as the temperature becomes higher.

In this manner, the cell current Ion varies depending on the temperature. In order to accurately sense the data of the programmed cell, it is necessary that the cell current Ion is smaller than the reference current IREF over the required operating temperature range. In other words, the data programming should be performed such that the condition in which the cell current Ion is smaller than the reference current IREF is maintained no matter how the temperature varies within the operating temperature range. The margin provided for that purpose is the "DC margin MD".

As shown in FIG. 3, the DC margin MD depending on the required operating temperature range is set between the program level IP and the reference current IREF. The threshold voltage Vt of the programmed cell is set such that the cell current Ion under the lowest temperature condition within the operating temperature range is smaller than at least the program level IP. As a result, the cell current Ion under the highest temperature condition within the operating temperature range is certainly smaller than at least the reference current IREF. Thus, the requirement of the DC margin MD is satisfied. As the required operating temperature range becomes wider, the DC margin MD also becomes wider. By providing the above-explained DC margin MD, the erroneous data judgment due to the temperature variation can be prevented. It should be noted that the DC margin MD with regard to the erased cell is assured by the speed margin MS.

The foregoing is the explanation of the speed margin MS and the DC margin MD in the general case. According to the present embodiment, not one kind of reference current IREF but the plurality kinds of reference currents (IREF1, IREF2) are used as the reference level. In this case, the speed margin MS and the DC margin MD are defined for each of the plurality kinds of reference currents.

For example, as shown in FIG. 3, a first reference current IREF1 and a second reference current IREF2 of two kinds are used as the reference levels. The first reference current IREF1 is set to be smaller than the second reference current IREF2. In other words, the first reference current IREF1 is set at a level away from the erase level IE, while the second reference current IREF2 is set at a level away from the program level IP. The speed margin MS and the DC margin MD can be defined for each of the reference currents IREF1 and IREF2.

1-3. High-speed Read Mode, Low-speed Read Mode

The sense amplifier circuit 30 generates the first read data DR1 and the second read data DR2 with regard to the same (identical) stored data DS, by using the first reference current IREF1 and the second reference current IREF2. The selector 40 selects any one of the first read data DR1 and the second read data DR2 in accordance with the mode signal MOD, and outputs the selected one as the output data Dout.

In the present embodiment, the mode signal MOD can specify two kinds of modes: a "high-speed read mode" and a "low-speed read mode". When the mode signal MOD indicates the "high-speed read mode", the selector 40 selects the first read data DR1 that is obtained by using the first reference current IREF1. On the other hand, when the mode signal MOD indicates the "low-speed read mode", the selector 40 selects the second read data DR2 that is obtained by using the second reference current IREF2.

(High-speed Read Mode)

At the time of the high-speed read mode, an interval from the read start timing to the data judgment timing is relatively short. As shown in FIG. 4, if the cell current Ion at the data judgment timing is smaller than the reference current IREF, the data of the read target cell is judged to be "0". As for the programmed cell (data "0"), there is no problem even if the data is judged to be "0". What should be cared at the time of the high-speed read mode is the erased cell (data "1").

Figure 6:
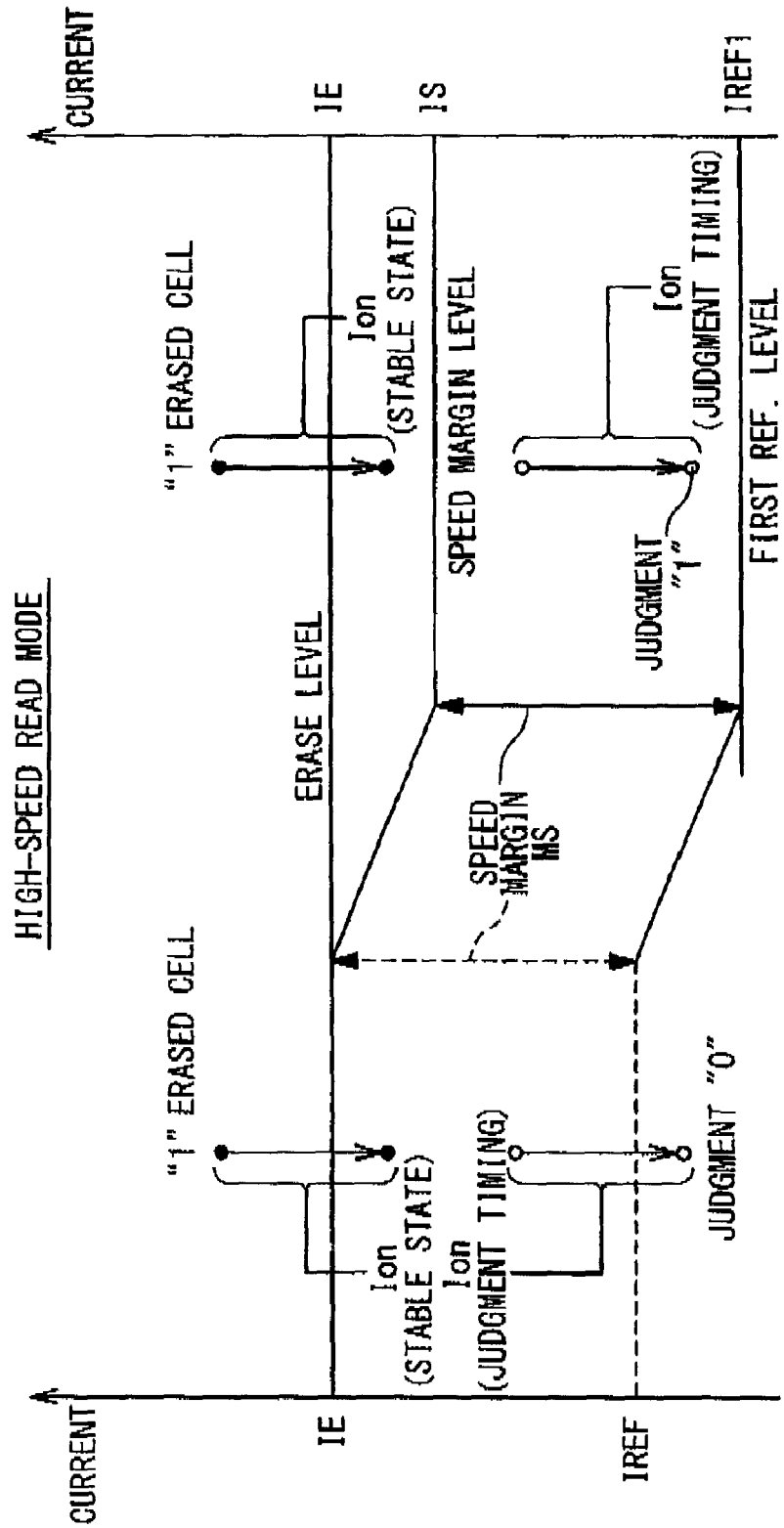
FIG. 6 is a conceptual diagram for explaining a high-speed read mode.

FIG. 6 is a conceptual diagram for explaining the high-speed read mode in the present embodiment. At the time of data erasing, the erased cell (data "1") is set such that the cell current Ion at the stable state exceeds the erase level IE. However, there is a case that electrons come into the floating gate of the erased cell as time advances. In that case, the threshold voltage Vt of the erased cell is increased and thus the cell current Ion at the stable state may become lower than the erase level IE. Such a cell is hereinafter referred to as a "data-dissipated cell".

With respect to the data-dissipated cell, with the decrease in the cell current Ion at the stable state (denoted by black circles in FIG. 6), the cell current Ion at the judgment timing (denoted by white circles in FIG. 6) is also decreased. In the example shown in FIG. 6, the cell current Ion at the judgment timing is smaller than the conventional reference current IREF. Therefore, the data of the data-dissipated cell is judged not to be "1" but to be "0". This is the erroneous judgment, and an erroneous data "0" is output. On the other hand, according to the present embodiment, the first reference current IREF1 smaller than the reference current IREF is used. In the example shown in FIG. 6, the cell current Ion at the judgment timing is larger than the first reference current IREF1. Therefore, even the data of the data-dissipated cell is correctly judged to be "1". That is to say, probability of the erroneous judgment with respect to the data-dissipated cell is reduced according to the present embodiment.

The foregoing can be explained from another point of view as follows. In FIG. 6, a level obtained by adding the speed margin MS to the first reference current IREF1 is shown as a "speed margin level IS". Since the first reference current IREF1 is smaller than the conventional reference current IREF, the speed margin level IS is lower than the erase level IE. If the cell current Ion at the stable state is larger than the speed margin level IS, the condition of the speed margin MS is satisfied and thus the data is correctly judged to be "1". With respect to the data-dissipated cell as well, if the cell current Ion at the stable state is larger than the speed margin level IS, the data is correctly judged to be "1" even if the cell current Ion at the stable state is lower than the erase level IE.

As described above, according to the present embodiment, the probability of the erroneous judgment with respect to the data-dissipated cell is reduced. The reason is that the first reference current IREF1 which is set at the level farther away from the erase level IE than the conventional reference level is used. It can be said that the first reference current IREF1 is a reference level suitable for reading the erased cell.

(Low-speed Read Mode)

At the time of the low-speed read mode, an interval from the read start timing to the data judgment timing is sufficiently long. The cell current Ion flowing through the erased cell is considered to become larger than the reference current IREF during the sufficient long interval. Therefore, probability that the data of the erased cell is correctly judged to be "1" is extremely high. What should be cared at the time of the low-speed read mode is the programmed cell (data "0").

Figure 7:
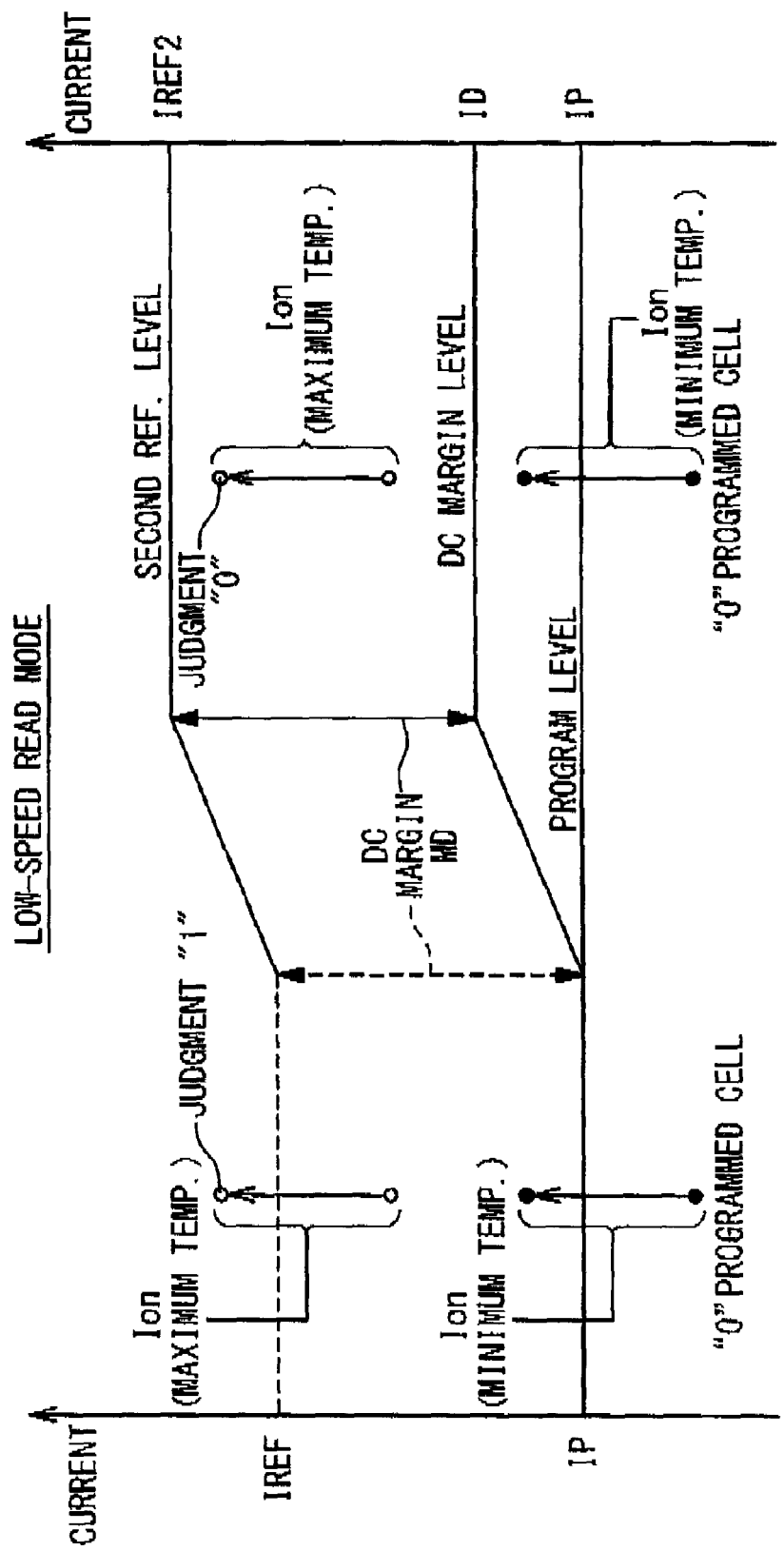
FIG. 7 is a conceptual diagram for explaining a low-speed read mode.

FIG. 7 is a conceptual diagram for explaining the low-speed read mode in the present embodiment. At the time of data programming, the programmed cell (data "0") is set such that the cell current Ion at the minimum temperature state is lower than the program level IP. However, there is a case that electrons leak from the floating gate of the programmed cell as time advances. In that case, the threshold voltage Vt of the programmed cell is decreased and thus the cell current Ion at the minimum temperature state may exceed the program level IP. Such a cell is also the data-dissipated cell.

With respect to the data-dissipated cell, with the increase in the cell current Ion at the minimum temperature state (denoted by black circles in FIG. 7), the cell current Ion at the maximum temperature state (denoted by white circles in FIG. 7) is also increased. In the example shown in FIG. 7, the cell current Ion at the maximum temperature state becomes larger than the conventional reference current IREF. This means that the data of the data-dissipated cell is judged not to be "0" but to be "1" depending on the temperature state. On the other hand, according to the present embodiment, the second reference current IREF2 larger than the reference current IREF is used. In the example shown in FIG. 7, the cell current Ion at the maximum temperature state is smaller than the second reference current IREF2. It is therefore assured that even the data of the data-dissipated cell is correctly judged to be "0" over the entire operating temperature range. That is to say, probability of the erroneous judgment with respect to the data-dissipated cell is reduced according to the present embodiment.

The foregoing can be explained from another point of view as follows. In FIG. 7, a level obtained by subtracting the DC margin MD from the second reference current IREF2 is shown as a "DC margin level ID". Since the second reference current IREF2 is larger than the conventional reference current IREF, the DC margin level ID is higher than the program level IP. If the cell current Ion at the minimum temperature state is smaller than the DC margin level ID, the condition of the DC margin MD is satisfied and thus the data is correctly judged to be With respect to the data-dissipated cell as well, if the cell current Ion at the minimum temperature state is smaller than the DC margin level ID, the data is correctly judged to be "0" even if the cell current Ion at the minimum temperature state is higher than the program level IP.

As described above, according to the present embodiment, the probability of the erroneous judgment with respect to the data-dissipated cell is reduced. The reason is that the second reference current IREF2 which is set at the level farther away from the program level IP than the conventional reference level is used. It can be said that the second reference current IREF2 is a reference level suitable for reading the programmed cell.

In the case of one kind of reference current IREF, the reference current IREF is used for both the erased cell and the programmed cell. According to the present embodiment, the first reference current IREF1 suitable for reading the erased cell and the second reference current IREF2 suitable for reading the programmed cell are separately prepared. As described above, what should be cared for from the viewpoint of the data dissipation is the erased cell in the case of the high-speed read mode while the programmed cell in the case of the low-speed read mode. Therefore, at the time of the high-speed read mode, the first read data DR1 read out by using the first reference current IREF1 is selected and the first read data DR1 is output as the output data Dout. On the other hand, at the time of the low-speed read mode, the second read data DR2 read out by using the second reference current IREF2 is selected and the second read data DR2 is output as the output data Dout. As a result, the reliability of the output data Dout is improved.

The setting of the mode signal MOD can be different between products provided with the semiconductor memory device 1. In a case of a product for which a high-speed read operation is required, the mode signal MOD is so set as to indicate the high-speed read mode. On the other hand, in a case of a product for which a low-speed read operation is just required, the mode signal MOD is so set as to indicate the low-speed read mode. The setting of the mode signal MOD can be carried out by a program stored in the microcomputer.

1-4. Effects

According to the present embodiment, as explained above, the two kinds of read data DR1 and DR2 are generated from the same stored data DS by using the two kinds of reference levels REF1 and REF2, respectively. Then, one suitable for the operation mode among the two kinds of read data DR1 and DR2 is selected as the output data Dout. Consequently, the reliability of the output data Dout is improved. Since the reliability of the output data Dout is improved, malfunction of the microcomputer provided with the semiconductor memory device 1 is reduced.

Also, according to the present embodiment, it is possible to support any of the high-speed read mode and the low-speed read mode by changing the setting of the mode signal MOD. It is not necessary to separately manufacture a semiconductor memory chip for the high-speed read mode and a semiconductor memory chip for the low-speed read mode. It is possible to support both of the read modes with the same circuit configuration. In that sense, it can be said that the semiconductor memory device 1 according to the present embodiment is versatile (universal).

2. Second Embodiment

Figure 8:
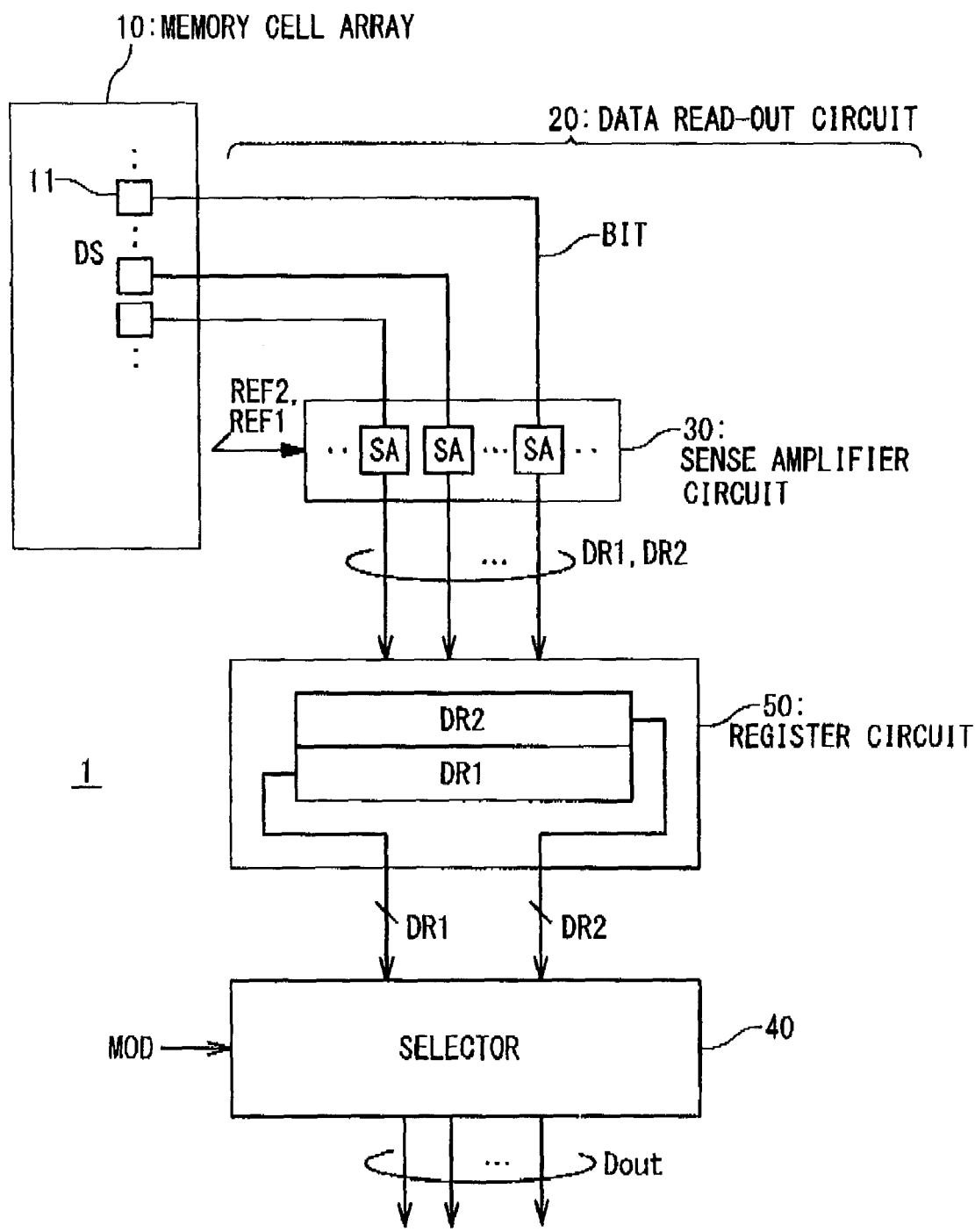
FIG. 8 is a block diagram schematically showing a configuration of a semiconductor memory device according to a second embodiment of the present invention.

FIG. 8 schematically shows a configuration of a semiconductor memory device 1 according to the second embodiment. In FIG. 8, the same reference numerals are given to the same components as those described in the first embodiment, and an overlapping description will be appropriately omitted.

In the foregoing first embodiment, the sense amplifier circuit 30 has the first sense amplifier circuit 31 and the second sense amplifier circuit 32, separately, and outputs the two kinds of read data DR1 and DR2 in parallel. In the second embodiment, the sense amplifier circuit 30 sequentially outputs the two kinds of read data DR1 and DR2. More specifically, the sense amplifier circuit 30 receives the first reference level REF1 and the second reference level REF2 in turn. The sense amplifier circuit 30 generates the first read data DR1 and the second read data DR2 in turn by using the first reference level REF1 and the second reference level REF2, respectively.

A register circuit 50 is provided between the sense amplifier circuit 30 and the selector 40. The sense amplifier circuit 30 sequentially outputs the two kinds of read data DR1 and DR2 to the register circuit 50. The first read data DR1 and the second read data DR2 are stored in the register circuit 50 in turn. For example, the register circuit 50 is constituted by a two-stage shift register, and each stage is provided with the same number of registers as the number of bits of the read data.

The first read data DR1 and the second read data DR2 which are stored in the register circuit 50 are simultaneously output to the selector 40 at a predetermined timing. The selector 40 selects any one of the first read data DR1 and the second read data DR2 in accordance with the mode signal MOD and outputs the selected one as the output data Dout to the bus.

According to the second embodiment, the same effects as in the first embodiment can be obtained.

3. Third Embodiment 3-1. Configuration and Operation

Figure 9:
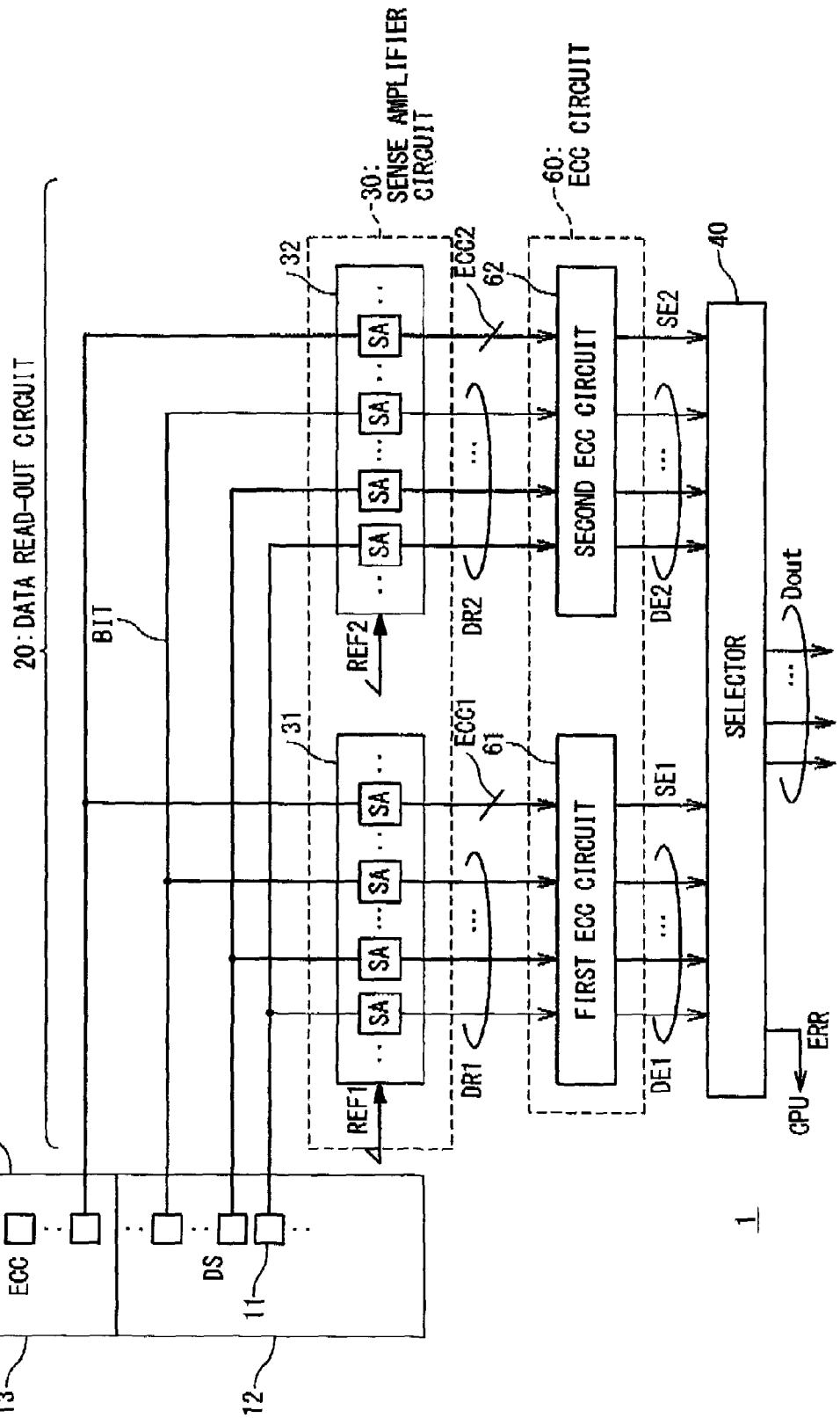
FIG. 9 is a block diagram schematically showing a configuration of a semiconductor memory device according to a third embodiment of the present invention.

FIG. 9 schematically shows a configuration of a semiconductor memory device 1 according to the third embodiment. In FIG. 9, the same reference numerals are given to the same components as those described in the first embodiment, and an overlapping description will be appropriately omitted.

According to the present embodiment, an ECC (Error Correction Code) circuit 60 is provided between the sense amplifier circuit 30 and the selector 40. The ECC circuit 60 executes an error correction processing with respect to the first read data DR1 and the second read data DR2. The performance of the error correction is determined based on required reliability and so forth. For example, the ECC circuit 60 is configured to be capable of detecting up to two bit errors and correcting up to one bit error. An error correction code ECC is used for the error correction processing.

As shown in FIG. 9, the memory cell array 10 includes a data region 12 and an ECC region 13. The above-mentioned stored data DS is stored in the memory cells 11 in the data region 12. On the other hand, the error correction code ECC that is associated with the stored data DS is stored in the memory cells 11 in the ECC region 13.

At a time of writing a certain stored data DS, an error correction code generation circuit (not shown) generates an error correction code ECC on the basis of the certain stored data DS. In a case where the stored data DS is of 8 bits, for example, the error correction code ECC is of 5 bits. It should be noted that the number of bits of the error correction code ECC varies depending on the number of bits of the stored data DS, the required reliability and the like. The generated error correction code ECC and the stored data DS are written to the memory cell array 10 by a writing circuit (not shown).

At the time of reading out a certain stored data DS, the first sense amplifier circuit 31 reads out an error correction code ECC associated with the certain stored data DS, by using the first reference level REF1. The error correction code ECC obtained by using the first reference level REF1 is hereinafter referred to as an error correction code ECC1. Also, the second sense amplifier circuit 32 reads out the error correction code ECC associated with the certain stored data DS, by using the second reference level REF2. The error correction code ECC obtained by using the second reference level REF2 is hereinafter referred to as an error correction code ECC2. The error correction codes ECC1 and ECC2 which are read out are input to the ECC circuit 60.

The ECC circuit 60 receives the two kinds of read data DR1 and DR2, which are obtained as a result of reading the same stored data DS, from the sense amplifier circuit 30. Moreover, the ECC circuit 60 receives the error correction codes ECC1 and ECC2 which are associated with the same stored data DS. Then, the ECC circuit 60 carries out the error correction processing for the two kinds of read data DR1 and DR2 by using the error correction codes ECC1 and ECC2, respectively. For example, let us consider a case where the ECC circuit 60 can detect up to two bit errors and correct up to one bit error by the error correction processing.

As a result of the error correction processing, the first read data DR1 becomes a first post-processing data DE1. Also, the second read data DR2 becomes a second post-processing data DE2. If no error bit exists in the first read data DR1, the first post-processing data DE1 is the same as the first read data DR1. If one error bit exists in the first read data DR1, the first post-processing data DE1 corresponds to a data obtained by correcting the one error bit in the first read data DR1. If two or more error bits exist in the first read data DR1, the first post-processing data DE1 becomes indefinite. The same applies to the second post-processing data DE2. The ECC circuit 60 outputs the two kinds of post-processing data DE1 and DE2 to the selector 40.

More specifically, the ECC circuit 60 according to the present embodiment includes a first ECC circuit 61 and a second ECC circuit 62. The first ECC circuit 61 receives the first read data DR1 and the error correction code ECC1, and performs the error correction processing with respect to the first read data DR1. Consequently, the first ECC circuit 61 generates the first post-processing data DE1 from the first read data DR1. Moreover, the first ECC circuit 61 generates a first error bit number signal SE1 indicating the number of error bits detected in the first read data DR1. The first ECC circuit 61 outputs the first post-processing data DE1 and the first error bit number signal SE1 to the selector 40.

The second ECC circuit 62 receives the second read data DR2 and the error correction code ECC2, and performs the error correction processing with respect to the second read data DR2. Consequently, the second ECC circuit 62 generates the second post-processing data DE2 from the second read data DR2. Moreover, the second ECC circuit 62 generates a second error bit number signal SE2 indicating the number of error bits detected in the second read data DR2. The second ECC circuit 62 outputs the second post-processing data DE2 and the second error bit number signal SE2 to the selector 40.

In this manner, the ECC circuit 60 according to the present embodiment receives the two kinds of data groups [DR1, ECC1] and [DR2, ECC2] in parallel, and carries out the error correction processing with respect to the two kinds of read data DR1 and DR2 in parallel. Consequently, the ECC circuit 60 generates the first post-processing data DE1 and the second post-processing data DE2, and outputs those post-processing data DE1 and DE2 to the selector 40 in parallel. Also, the ECC circuit 60 outputs the first error bit number signal SE1 and the second error bit number signal SE2 to the selector 40.

The selector 40 selects any one of the first post-processing data DE1 and the second post-processing data DE2, and outputs the selected one as the output data Dout to the bus. Here, the selector 40 according to the present embodiment performs the selection based on the numbers of error bits indicated by the first error bit number signal SE1 and the second error bit number signal SE2. In other words, the control signal for specifying the operation of the selector 40 in the present embodiment is the first error bit number signal SE1 and the second error bit number signal SE2.

FIG. 10 shows one example of logic of the selector 40 according to the present embodiment. It is assumed that each of the error bit number signals SE1 and SE2 is a 2-bit signal. When the error bit number signal SE is "00", "01" and "10", the number of error bits is 0, 1 and 2, respectively. As shown in FIG. 10, a post-processing data (DE1 or DE2) relating to an error bit number signal (SE1 or SE2) indicating a smaller number of error bits is selected by the selector 40. In other words, a post-processing data (DE1 or DE2) generated from a read data (DR1 or DR2) having the minimum number of error bits is selected by the selector 40.

For example, let us consider a case where one error bit exists in the first read data DR1 and two error bits exist in the second read data DR2 (SE1="01", SE2="10"). In this case, the error in the first read data DR1 is correctable, while the error correction of the second read data DR2 is impossible. Therefore, the first post-processing data DE1 generated from the first read data DR1 is selected as the output data Dout. The selected first post-processing data DE1 is the expected value equal to the data at the time when it is written.

If two error bits exist in both of the read data DR1 and DR2 (SE1="10", SE2="10"), the error correction of any of the read data DR1 and DR2 is impossible. Each of the first post-processing data DE1 and the second post-processing data DE2 can be inaccurate and different from the data at the time when it is written. In this case, the selector 40 outputs an error signal ERR for stopping the microcomputer to a CPU. For example, the error signal ERR is obtained by an AND operation of the upper bit of the first error bit number signal SE1 and the upper bit of the second error bit number signal SE2. If the error signal ERR becomes "1", the CPU stops the operation of the microcomputer.

It can be said that the selector 40 and the ECC circuit 60 together serve as a "correction circuit". Also, the selector 40 may be provided within the ECC circuit 60.

3-2. High-speed Read Mode, Low-speed Read Mode

Let us consider a case as an example where the present embodiment is applied to an EEPROM, as in the first embodiment.

(High-speed Read Mode)

Figure 11:
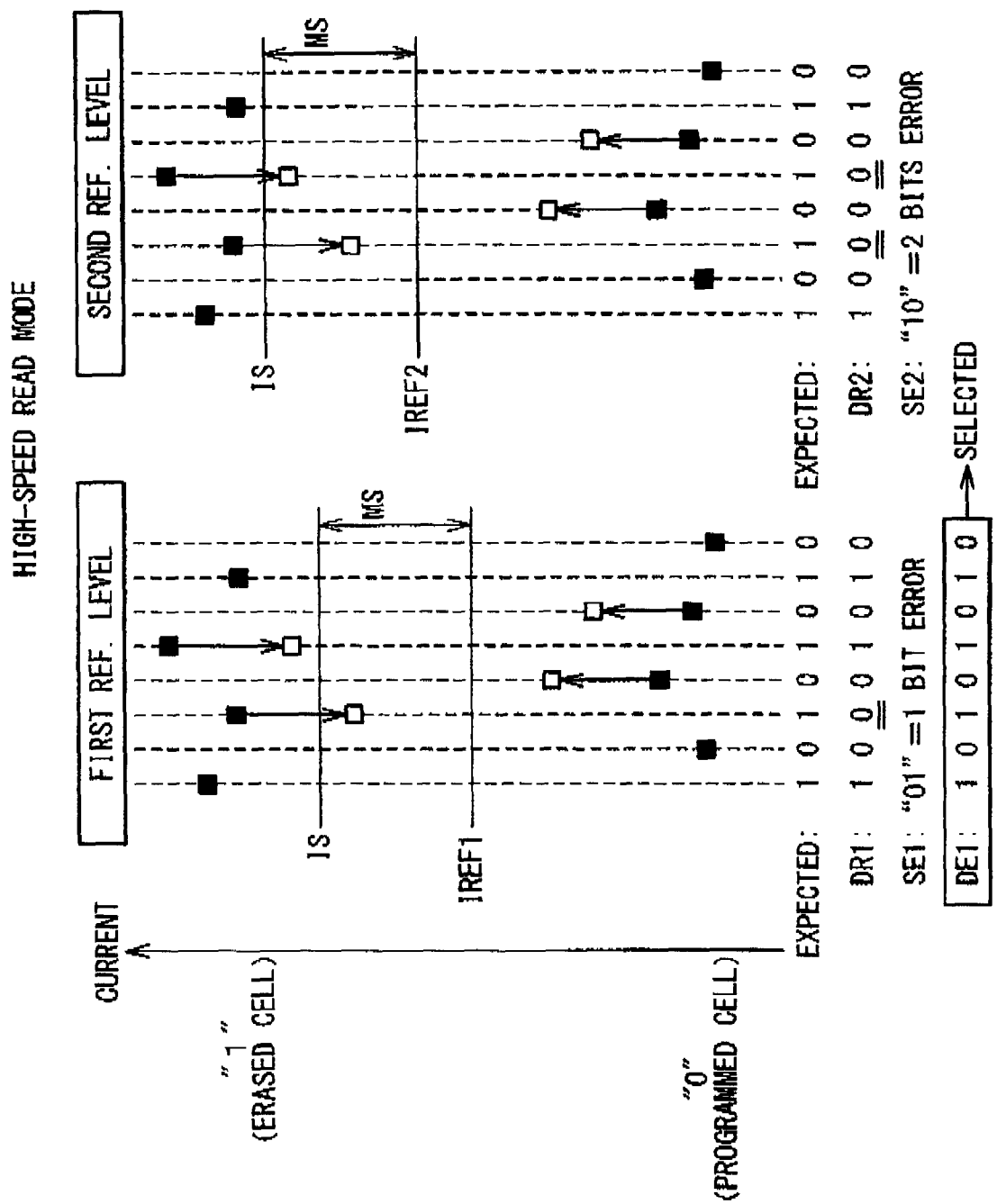
FIG. 11 is a conceptual diagram for explaining an example of an operation in the high-speed read mode.

FIG. 11 is a conceptual diagram for explaining one example of the processing in the high-speed read mode. As in the foregoing FIGS. 6 and 7, the vertical axis indicates the current value. Let us consider a case where the stored data DS (expected value) at the time of writing is an 8-bit data "10101010". That is to say, the stored data DS is stored in four erased cells and four programmed cells. Moreover, due to the passage of time after the writing, a part of the erased cells becomes the data-dissipated cell and the cell current Ion thereof is decreased. Also, due to the passage of time after the writing, a part of the programmed cells becomes the data-dissipated cell and the cell current Ion thereof is increased.

At the time of the high-speed read mode, the data judgment is correctly performed with regard to the programmed cell (the data "0"). As described above, what should be cared at the time of the high-speed read mode is the erased cell (data "1").

The first sense amplifier circuit 31 reads out the stored data DS by using the first reference current IREF1. At this time, as shown in FIG. 11, the cell current Ion (in the stable state) flowing through one erased cell is lower than the speed margin level IS, and thus the first read data DR1 becomes "10001010". The first ECC circuit 61 detects one error bit by using the error correction code ECC1. Therefore, the first error bit number signal SE1 is "01". Also, the first ECC circuit 61 corrects the one error bit in the first read data DR1 by using the error correction code ECC1 to generate the first post-processing data DE1. The obtained first post-processing data DE1 is "10101010" which is equal to the expected value.

The second sense amplifier circuit 32 reads out the stored data DS by using the second reference current IREF2 larger than the first reference current IREF1. At this time, the cell currents Ion (in the stable state) flowing through two erased cells are lower than the speed margin level IS, and thus the second read data DR2 becomes "10000010". The second ECC circuit 62 detects two error bits by using the error correction code ECC2. Therefore, the second error bit number signal SE2 is "10". In this case, the error correction of the second read data DR2 is impossible, and thus the second post-processing data DE2 is indefinite.

In accordance with the logic shown in FIG. 10, the selector 40 outputs the first post-processing data DE1 as the output data Dout. As a result, the accurate data equal to the expected value is obtained as the output data Dout.

(Low-speed Read Mode)

Figure 12:
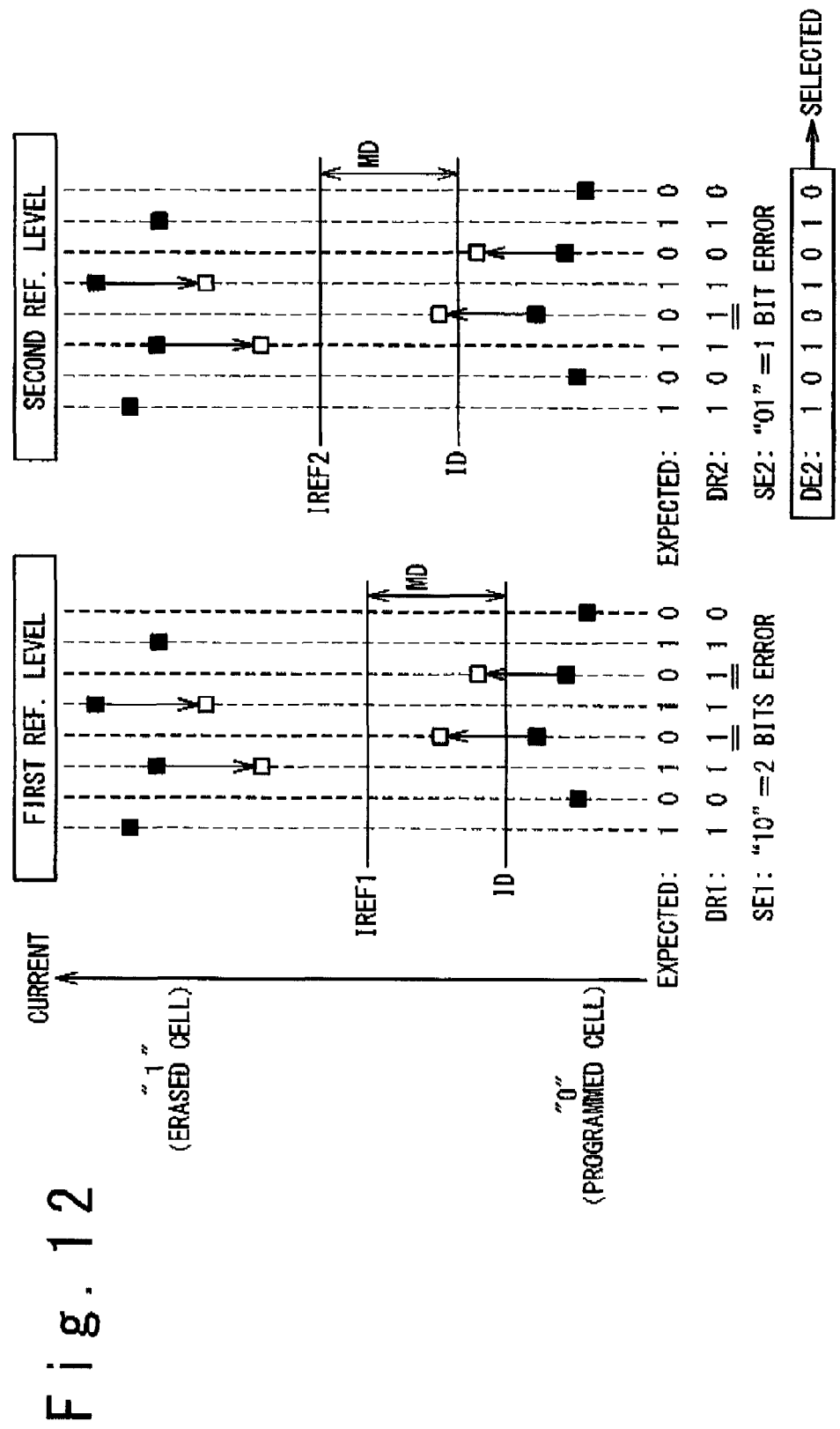
FIG. 12 is a conceptual diagram for explaining an example of an operation in the low-speed read mode.

FIG. 12 is a conceptual diagram for explaining one example of the processing in the low-speed read mode. The state of the stored data DS is the same as that in FIG. 11. At the time of the low-speed read mode, the data judgment is correctly performed with regard to the erased cell (the data As described above, what should be cared at the time of the low-speed read mode is the programmed cell (data "0").

The first sense amplifier circuit 31 reads out the stored data DS by using the first reference current IREF1. At this time, the cell currents Ion (at the minimum temperature state) flowing through two programmed cells exceed the DC margin level ID, and thus the first read data DR1 can become "10111110" depending on the temperature state. The first ECC circuit 61 detects two error bits by using the error correction code ECC1. Therefore, the first error bit number signal SE1 is "10". In this case, the error correction of the first read data DR1 is impossible, and thus the first post-processing data DE1 is indefinite.

The second sense amplifier circuit 32 reads out the stored data DS by using the second reference current IREF2 larger than the first reference current IREF1. At this time, the cell current Ion (at the minimum temperature state) flowing through one programmed cell exceeds the DC margin level ID, and thus the second read data DR2 can become "10111010" depending on the temperature state. The second ECC circuit 62 detects one error bit by using the error correction code ECC2. Therefore, the second error bit number signal SE2 is "01". Also, the second ECC circuit 62 corrects the one error bit in the second read data DR2 by using the error correction code ECC2 to generate the second post-processing data DE2. The obtained second post-processing data DE2 is "10101010" which is equal to the expected value.

In accordance with the logic shown in FIG. 10, the selector 40 outputs the second post-processing data DE2 as the output data Dout. As a result, the accurate data equal to the expected value is obtained as the output data Dout.

3-3. Effects

According to the present embodiment, as described above, the two kinds of read data DR1 and DR2 are generated from the same stored data DS by using the two kinds of reference levels REF1 and REF2, respectively. Moreover, the two kinds of post-processing data DE1 and DE2 are generated through the error correction processing. Then, a preferable one of the two kinds of post-processing data DE1 and DE2 is automatically selected as the output data Dout. More specifically, based on the error bit number signals SE1 and SE2, a post-processing data (DE1 or DE2) corresponding to a read data (DR1 or DR2) having the smaller number of error bits is selected as the output data Dout. As a result, the reliability of the output data Dout is improved. Since the reliability of the output data Dout is improved, malfunction of the microcomputer provided with the semiconductor memory device 1 is reduced.

It can be also said that the error correction processing by the ECC circuit 60 is carried out more effectively according to the present embodiment. In a case where only one kind of reference level is used, only one kind of read data DR is obtained. If two or more error bits exist in the read data DR, the error correction is no longer possible. In that case, the microcomputer is stopped. On the other hand, in the present embodiment, a plurality kinds of read data (DR1, DR2) are obtained by using a plurality kinds of reference levels (REF1, REF2). Since the number of targets for which the error correction is performed is increased, the success rate of the error correction is enhanced and thus the probability that the microcomputer stops its operation is reduced.

Moreover, according to the present embodiment, the most preferable data is automatically selected as the output data Dout, irrespective of the operation mode (the high-speed read mode or the low-speed read mode). The reason is that the operation of the selector 40 depends not on the mode signal MOD but on the error bit number signals SE1 and SE2. The selector 40 can select an optimum data having the minimum number of error bits, irrespective of the operation mode. In other words, the circuit configuration according to the present embodiment can support any operation mode and cope with operation speeds of every frequencies. In that sense, it can be said that the semiconductor memory device 1 according to the present embodiment is versatile (universal).

Also, according to the present embodiment, it is not necessary to input the mode signal MOD from the outside of the semiconductor memory device 1. The operation of the selector 40 is automatically controlled by the error bit number signals SE1 and SE2 which are generated within the semiconductor memory device 1.

Alternatively, the third embodiment can be combined with the foregoing first embodiment. That is to say, the mode signal MOD may be input to the selector 40 of the present embodiment. In this case, the selector 40 can refer to even the mode signal MOD in addition to the error bit number signals SE1 and SE2. For example, let us consider a case where three or more error bits exist in the first read data DR1 while one error bit exists in the second read data DR2. In this case, the second error bit number signal SE2 is "01", while the first error bit number signal SE1 is indefinite. Here, there is a possibility that the indefinite first error bit number signal SE1 happens to become the same "01". However, it is desirable that the selector 40 selects not the first post-processing data DE1 but the second post-processing data DE2. According to the logic shown in FIG. 10, the first post-processing data DE1 is preferentially selected if the error bit number signals SE1 and SE2 indicate the same value, which is not always preferable. In the case where the error bit number signals SE1 and SE2 indicate the same value, there is a chance that the reliability of the output data Dout is improved by further referring to an additional information. The additional information is the mode signal MOD. The selector 40 basically determines the output data Dout on the basis of the error bit number signals SE1 and SE2. However, if the error bit number signals SE1 and SE2 indicate the same value, the mode signal MOD is further considered. In the case when the mode signal MOD indicates the high-speed read mode, the selector 40 selects the first post-processing data DE1 as the output data Dout. On the other hand, in the case when the mode signal MOD indicates the low-speed read mode, the selector 40 selects the second post-processing data DE2 as the output data Dout. Consequently, a trouble caused by the unexpected coincidence of the error bit number signals SE1 and SE2 can be solved.

4. Fourth Embodiment

Figure 13:
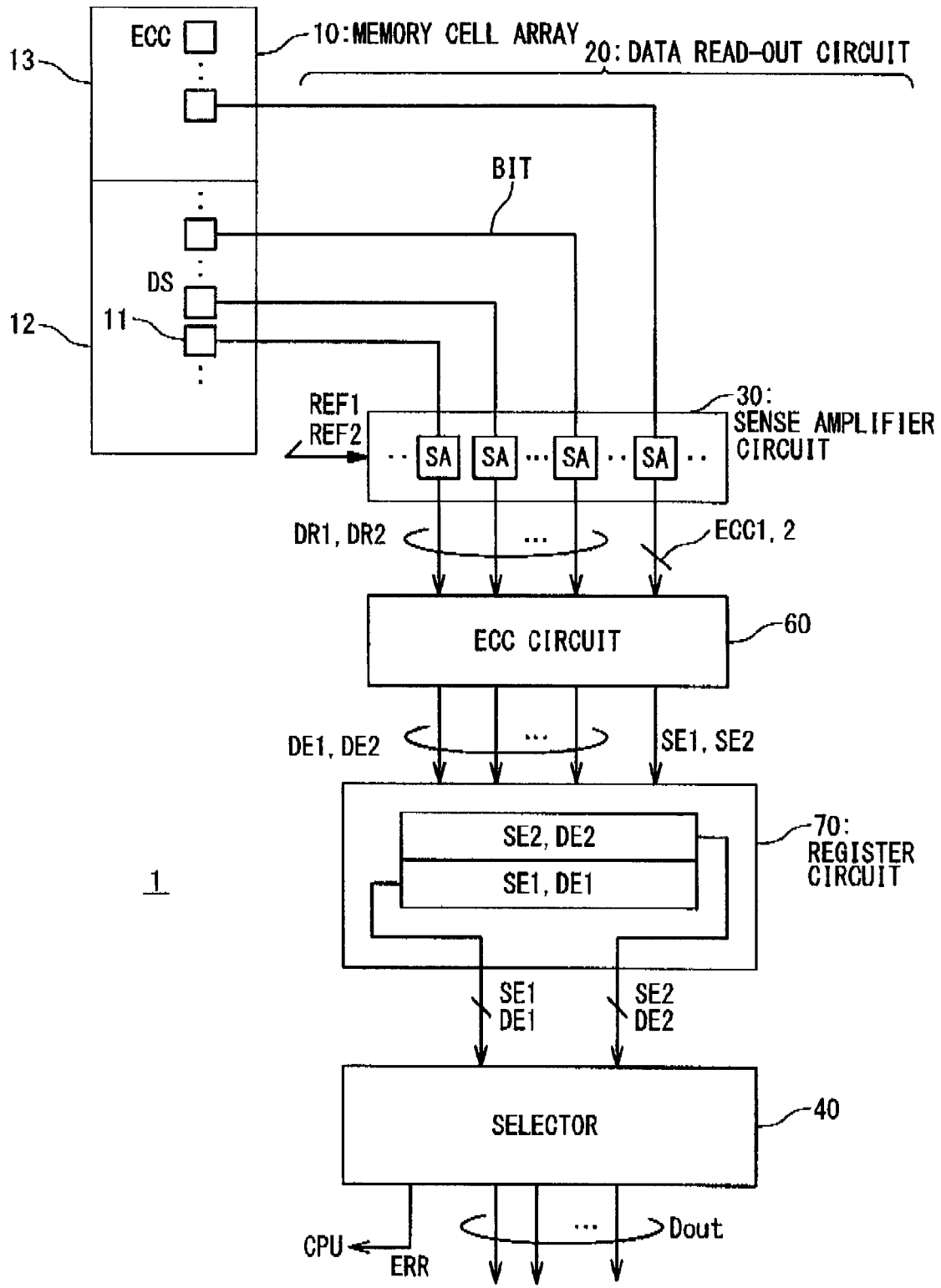
FIG. 13 is a block diagram schematically showing a configuration of a semiconductor memory device according to a fourth embodiment of the present invention.

FIG. 13 schematically shows a configuration of a semiconductor memory device 1 according to the fourth embodiment. In FIG. 13, the same reference numerals are given to the same components as those described in the third embodiment, and an overlapping description will be appropriately omitted.

In the foregoing third embodiment, the sense amplifier circuit 30 has the first sense amplifier circuit 31 and the second sense amplifier circuit 32 separately, and outputs the two kinds of data groups [DR1, ECC1] and [DR2, ECC2] in parallel. In the fourth embodiment, the sense amplifier circuit 30 sequentially outputs the two kinds of data groups [DR1, ECC1] and [DR2, ECC2]. More specifically, the sense amplifier circuit 30 receives the first reference level REF1 and the second reference level REF2 in turn. The sense amplifier circuit 30 generates the data group [DR1, ECC1] and the data group [DR2, ECC2] in turn by using the first reference level REF1 and the second reference level REF2, respectively.

Also, in the foregoing third embodiment, the ECC circuit 60 has the first ECC circuit 61 and the second ECC circuit 62 separately, and executes the error correction processing in parallel. In the fourth embodiment, the ECC circuit 60 sequentially executes the error correction processing. More specifically, the ECC circuit 60 receives the data group [DR1, ECC1] and the data group [DR2, ECC2] in turn, and carries out the error correction processing for the first read data DR1 and the second read data DR2 in turn. The ECC circuit 60 sequentially outputs the data group [DE1, SE1] and the data group [DE2, SE2].

A register circuit 70 is provided between the ECC circuit 60 and the selector 40. The data group [DE1, SE1] and the data group [DE2, SE2] are stored in the register circuit 70 in turn. For example, the register circuit 70 is constituted by a two-stage shift register, and each stage is provided with the same number of registers as the total number of bits of the post-processing data and the error bit number signal.

The data group [DE1, SE1] and the data group [DE2, SE2] which are stored in the register circuit 70 are simultaneously output to the selector 40 at a predetermined timing. The selector 40 selects any one of the first post-processing data DE1 and the second post-processing data DE2 on the basis of the error bit number signals SE1 and SE2, and outputs the selected one as the output data Dout to the bus.

According to the fourth embodiment, the same effects as in the third embodiment can be obtained. Moreover, the circuit area as a whole is reduced, since it is not necessary to provide the first ECC circuit 61 and the second ECC circuit 62 separately. It is also possible to combine the second embodiment and the fourth embodiment.

5. Reference Level Generation Circuit

Figure 14:
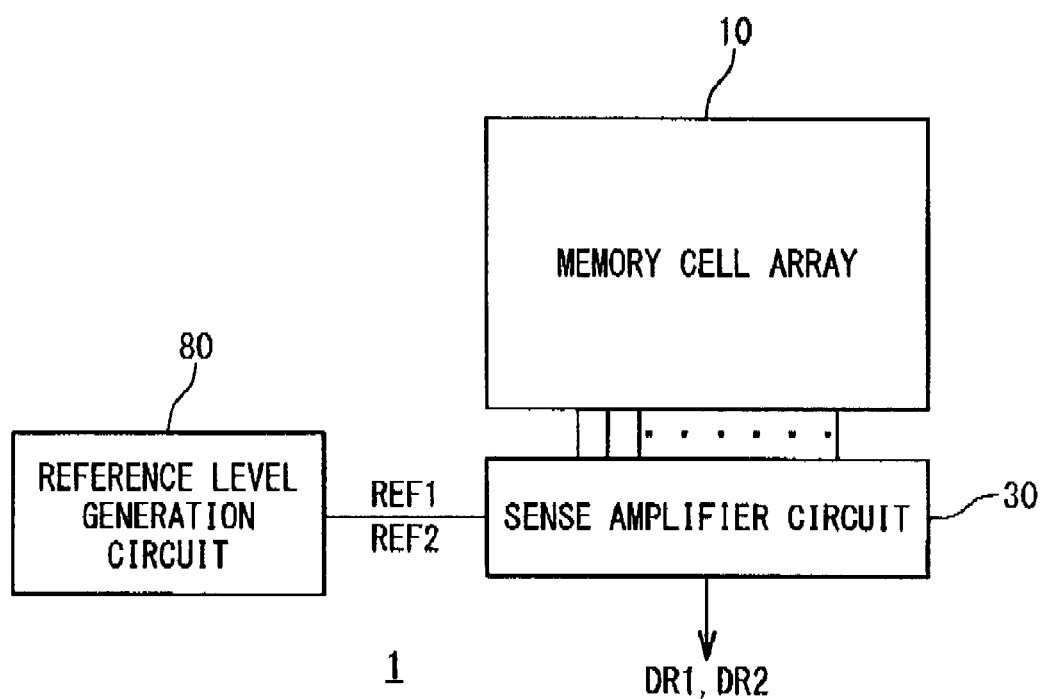
FIG. 14 is a block diagram showing a configuration of a semiconductor memory device according to the embodiments of the present invention.

The first reference level REF1 and the second reference level REF2 mentioned above are generated by a reference level generation circuit 80. FIG. 14 shows a configuration of the semiconductor memory device 1 including the reference level generation circuit 80. As shown in FIG. 14, the reference level generation circuit 80 is connected to the sense amplifier circuit 30. The reference level generation circuit 80 outputs the first reference level REF1 and the second reference level REF2 to the sense amplifier circuit 30. The reference level means a reference current or reference potential.

For example, let us consider a case where the data sensing is performed based on a current-sense method using the reference current. In this case, the reference level generation circuit 80 is a constant current circuit that is configured to generate the first reference current IREF1 and the second reference current IREF2. In the case where the sense amplifier circuit 30 carries out the parallel processing (the first and third embodiments), the reference level generation circuit 80 outputs the first reference current IREF1 and the second reference current IREF2 simultaneously. In the case where the sense amplifier circuit 30 carries out the sequential processing (the second and fourth embodiments), the reference level generation circuit 80 switches the first reference current IREF1 and the second reference current IREF2 and outputs in turn.

Figure 15:
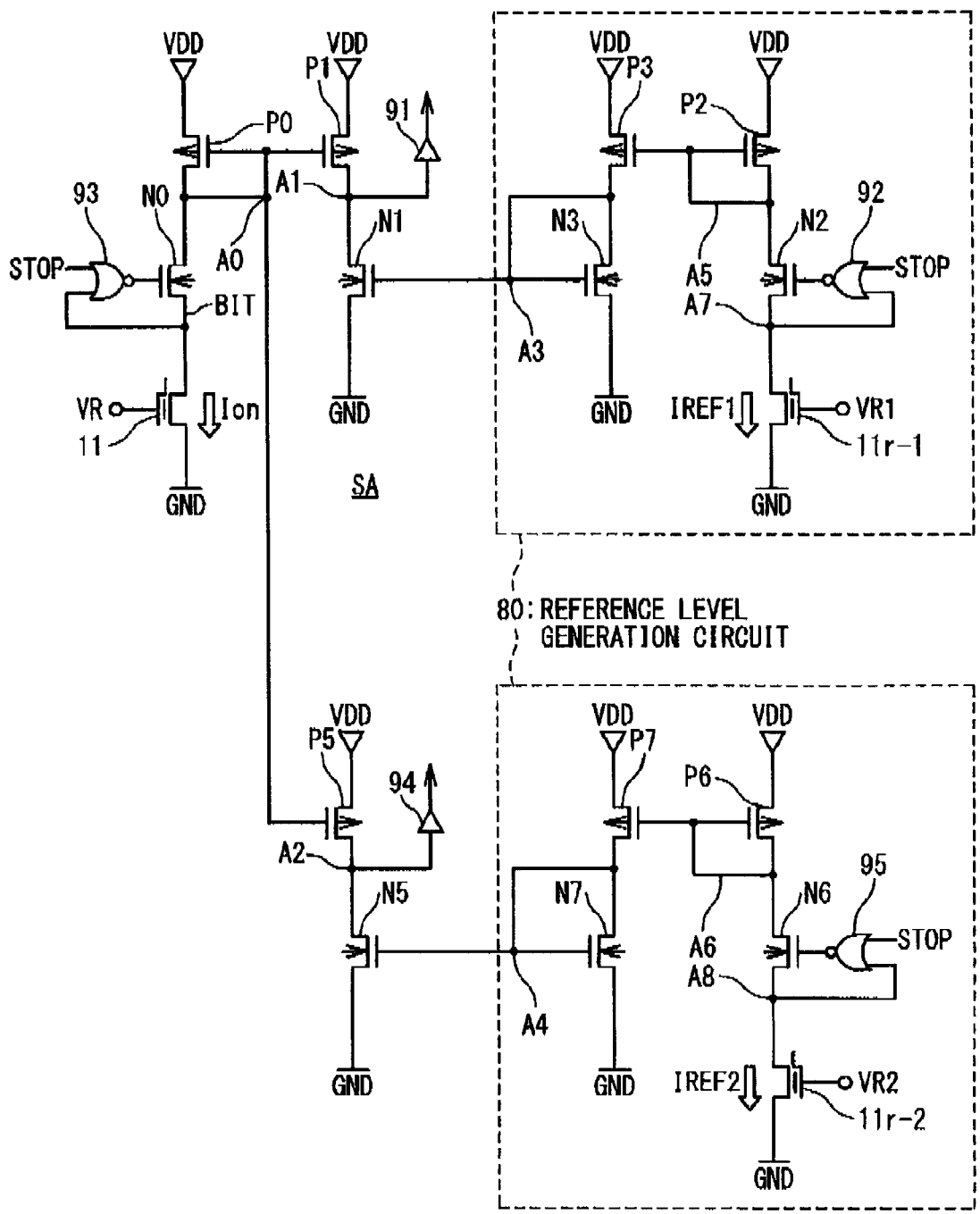
FIG. 15 is a circuit diagram showing an example of a configuration of a reference level generation circuit and a sense amplifier according to the embodiments of the present invention.

FIG. 15 shows an example of the reference level generation circuit 80 and its periphery used in the current-sense method. More specifically, shown in FIG. 15 are a certain memory cell 11, a current mirror type sense amplifier SA connected to the memory cell 11, and the reference level generation circuit 80.

In the present example, the reference level generation circuit 80 includes reference cells 11r-1 and 11r-2 in the memory cell array 10. The reference currents IREF1 and IREF2 are generated by using the reference cells 11r-1 and 11r-2, respectively. Each of the reference cells 11r-1 and 11r-2 has the same structure as the memory cell 11. Alternatively, the control gate and the floating gate may be short-circuited in the reference cells 11r-1 and 11r-2.

The sense amplifier SA has NMOS transistors N0, N1 and N5 and PMOS transistors P0, P1 and P5. Gates of the PMOS transistors P0 and P1 are connected to a common node A0. The gate and a drain of the PMOS transistor P0 are connected to each other. That is, the PMOS transistors P0 and P1 form a current mirror circuit. Similarly, the PMOS transistors P0 and P5 form another current mirror circuit.

The drain of the PMOS transistor P0 is connected to a drain of the NMOS transistor N0. A source of the NMOS transistor N0 is connected through the bit line BIT to the memory cell 11, and its gate is connected to an output of an NOR 93. The NOR 93 turns off the NMOS transistor N0 in response to a stop signal STOP and thereby prevents current-flow during a period when the current is unnecessary.

A drain of the PMOS transistor P1 is connected through a node A1 to a drain of the NMOS transistor N1. A gate of the NMOS transistor N1 is connected to a node A3. The node A3 is connected to a gate and a drain of a NMOS transistor N3. That is, the NMOS transistors N1 and N3 form a current mirror circuit. The drain of the NMOS transistor N3 is connected to a drain of a PMOS transistor P3. A gate of the PMOS transistor P3 is connected to a node A5. The node A5 is connected to a gate and a drain of a PMOS transistor P2. That is, the PMOS transistors P2 and P3 form a current mirror circuit.

The drain of the PMOS transistor P2 is connected to a drain of a NMOS transistor N2. A source of the NMOS transistor N2 is connected to a node A7, and its gate is connected to an output of a NOR 92. The NOR 92 turns off the NMOS transistor N2 in response to a stop signal STOP and thereby prevents current-flow during a period when the current is unnecessary. Moreover, the node A7 is connected to the reference cell 11r-1.

Similarly, a drain of the PMOS transistor P5 is connected through a node A2 to a drain of the NMOS transistor N5. A gate of the NMOS transistor N5 is connected to a node A4. The node A4 is connected to a gate and a drain of a NMOS transistor N7. That is, the NMOS transistors N5 and N7 form a current mirror circuit. The drain of the NMOS transistor N7 is connected to a drain of a PMOS transistor P7. A gate of the PMOS transistor P7 is connected to a node A6. The node A6 is connected to a gate and a drain of a PMOS transistor P6. That is, the PMOS transistors P6 and P7 form a current mirror circuit.

The drain of the PMOS transistor P6 is connected to a drain of a NMOS transistor N6. A source of the NMOS transistor N6 is connected to a node A8, and its gate is connected to an output of a NOR 95. The NOR 95 turns off the NMOS transistor N6 in response to a stop signal STOP and thereby prevents current-flow during a period when the current is unnecessary. Moreover, the node A8 is connected to the reference cell 11r-2.

At the time of reading data of the memory cell 11, the read voltage VR is applied to the control gate of the memory cell transistor that is the memory cell 11. As a result, the cell current Ion flows through the memory cell 11. The cell current Ion also flows through the PMOS transistor P0. Moreover, a mirror current equal to the cell current Ion flows through the PMOS transistors P1 and P5 due to the current mirror circuits.

At the same time, a voltage VR1 is applied to the control gate of the reference cell 11r-1. The reference cell 11r-1 is designed such that the first reference current IREF1 flows when the voltage VR1 is applied to the control gate. As a result, the first reference current IREF1 flows through the PMOS transistor P2. Also, a mirror current of the first reference current IREF1 flows through the NMOS transistor N1 due to the current mirror circuits.

Also, a voltage VR2 is applied to the control gate of the reference cell 11r-2. The reference cell 11r-2 is designed such that the second reference current IREF2 flows when the voltage VR2 is applied to the control gate. As a result, the second reference current IREF2 flows through the PMOS transistor P6. Also, a mirror current of the second reference current IREF2 flows through the NMOS transistor N5 due to the current mirror circuits.

In this manner, the first reference current IREF1 and the second reference current IREF2 are simultaneously supplied from the reference level generation circuit 80 at the time of data reading. The mirror current equal to the cell current Ion flows the power source to the node A1, while the mirror current equal to the first reference current IREF1 flows from the node A1 to the ground. Also, the mirror current equal to the cell current Ion flows from the power source to the node A2, while the mirror current equal to the second reference current IREF2 flows from the node A2 to the ground.

In a case when the memory cell 11 is the erased cell (data "1"), the cell current Ion becomes larger than the reference currents IREF1 and IREF2. Therefore, potential at the node A1 is increased to near the power source potential VDD. Thus, the data "1" is output from the sense amplifier SA through a buffer 91 connected to the node A1. Similarly, potential at the node A2 is increased to near the power source potential VDD. Thus, the data "1" is output from the sense amplifier SA through a buffer 94 connected to the node A2. It should be noted that the data dissipation is not considered here.

On the other hand, in a case when the memory cell 11 is the programmed cell (data "0"), the cell current Ion becomes smaller than the reference currents IREF1 and IREF2. Therefore, potential at the node A1 is decreased to near the ground potential GND. Thus, the data "0" is output from the sense amplifier SA through the buffer 91 connected to the node A1. Similarly, potential at the node A2 is decreased to near the ground potential GND. Thus, the data "0" is output from the sense amplifier SA through the buffer 94 connected to the node A2. It should be noted that the data dissipation is not considered here.

The circuit shown in FIG. 15 can be applied to the above-described first and third embodiments in which the parallel processing is performed.

Figure 16:
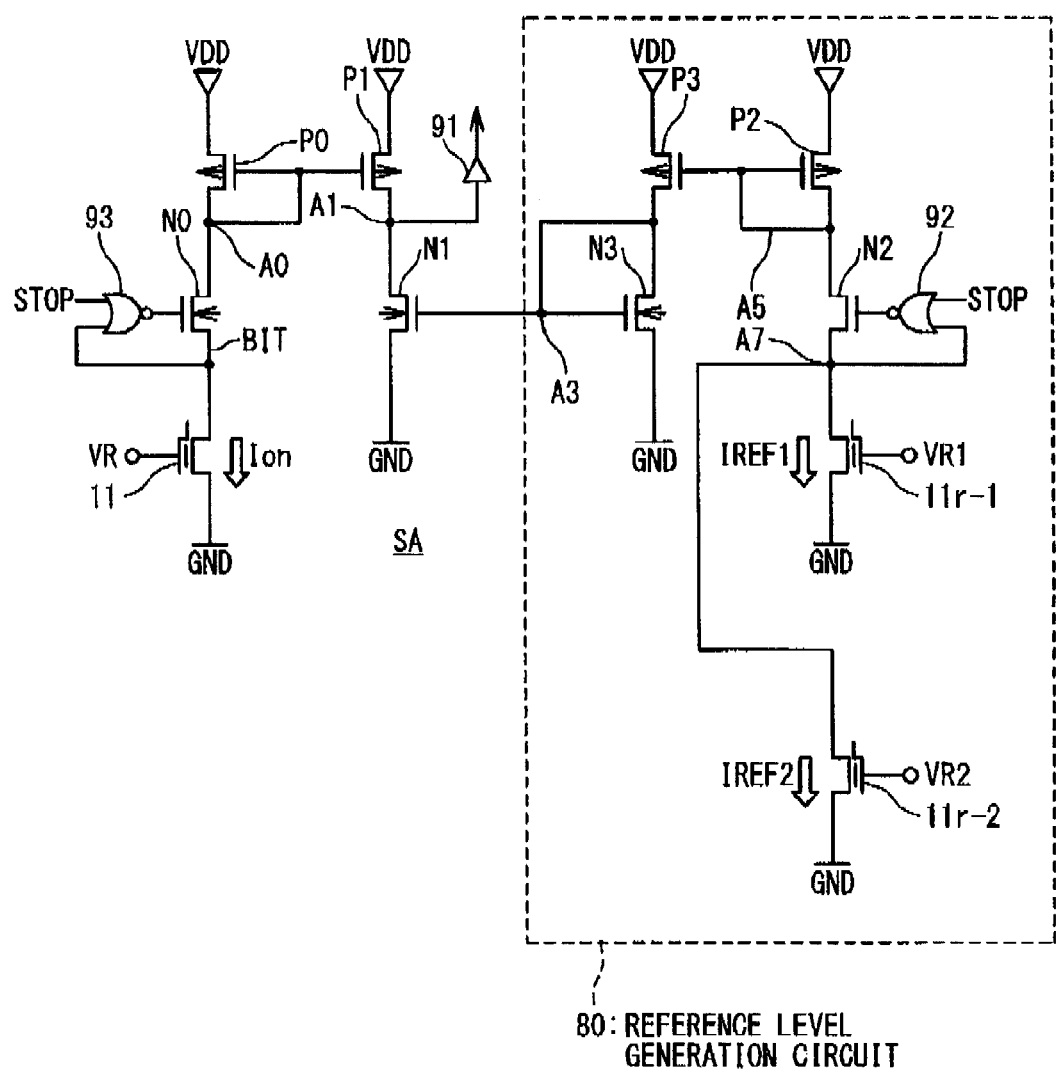
FIG. 16 is a circuit diagram showing another example of a configuration of a reference level generation circuit and a sense amplifier according to the embodiments of the present invention.

FIG. 16 shows an example of the circuit that can be applied to the above-described second and fourth embodiments in which the sequential processing is performed. In FIG. 16, the same reference numerals are given to the same components as those in FIG. 15.

In the reference level generation circuit 80 shown in FIG. 16, the reference cell 11r-2 is connected to the node A7. At the time when the first reference current IREF1 is supplied to the sense amplifier SA, the voltage VR1 is applied to the control gate of the reference cell 11r-1, while the voltage of 0 V is applied to the control gate of the reference cell 11r-2. As a result, only the first reference current IREF1 is supplied from the reference level generation circuit 80. On the other hand, at the time when the second reference current IREF2 is supplied to the sense amplifier SA, the voltage VR2 is applied to the control gate of the reference cell 11r-2, while the voltage of 0 V is applied to the control gate of the reference cell 11r-1. As a result, only the second reference current IREF2 is supplied from the reference level generation circuit 80. By temporally switching the applications of the voltages VR1 and VR2, it is possible to temporally switch the first reference current IREF1 and the second reference current IREF2 to be generated.

6. Summary

According to the embodiments of the present invention, the two kinds of reference levels REF1 and REF2 are used and hence the two kinds of read data DR1 and DR2 are obtained from the same stored data DS. The selector 40 selects a preferable one of the two kinds of read data DR1 and DR2, as the output data Dout. As a result, the reliability of the output data Dout is improved.

It should be noted that the present invention is not limited to the EEPROM. The present invention can be applied to a DRAM and the like. Also, more than two kinds of the reference levels can be used. Moreover, the data stored in the memory cell 11 may be multiple-value data. It is apparent that the present invention is not limited to the above embodiments and may be modified and changed without departing from the scope and spirit of the invention.

What is claimed is:

1. A semiconductor memory device comprising a data read-out circuit,
    said data read-out circuit comprising:
    a sense amplifier circuit configured to sense a data stored in a memory cell array by simultaneously comparing same stored data with a plurality of reference levels to simultaneously generate a plurality of read data based on said same stored data, and output said plurality of read data with regard to said same stored data; and
    a selector configured to select data corresponding to one of said simultaneously generated plurality of read data based on a control signal and output said selected data as an output data.

2. A semiconductor memory device comprising a data read-out circuit,
    said data read-out circuit comprising:
    a sense amplifier circuit configured to sense a stored data stored in a memory cell array by using a plurality of reference levels to generate a plurality of read data, respectively, and output said plurality of read data with regard to said stored data;
    a selector configured to select a data corresponding to any one of said plurality of read data based on a control signal and output said selected data as an output data; and
    an error correction code (ECC) circuit configured to detect respective numbers of error bits in said plurality of read data by using an error correction code associated with said stored data,
    wherein said ECC circuit generates a plurality of error bit number signals indicating said detected respective numbers of error bits and outputs said plurality of error bit number signals as said control signal to said selector.

3. The semiconductor memory device according to claim 2, wherein said selector refers to said plurality of error bit number signals and selects a data corresponding to one of said plurality of read data having a minimum number of error bits, as said output data.

4. The semiconductor memory device according to claim 2,
    wherein said ECC circuit generates a plurality of post-processing data respectively from said plurality of read data through error correction processing by using said error correction code and outputs said plurality of post-processing data together with said plurality of error bit number signals to said selector,
    wherein said selector detects one of said plurality of error bit numbers signals indicating a minimum number of error bits and selects one of said plurality of post-processing data relating to said detected one error bit number signal, as said output data.

5. The semiconductor memory device according to claim 4,
    wherein said sense amplifier circuit outputs said plurality of read data to said ECC circuit in parallel,
    wherein said ECC circuit executes said error correction processing with respect to said plurality of read data in parallel and outputs said plurality of post-processing data in parallel.

6. The semiconductor memory device according to claim 4,
    wherein said sense amplifier circuit outputs said plurality of read data sequentially to said ECC circuit,
    wherein said ECC circuit executes said error correction processing with respect to said plurality of read data sequentially and outputs said plurality of post-processing data sequentially.

7. A semiconductor memory device comprising a data read-out circuit,
    said data read-out circuit comprising:
    a sense amplifier circuit configured to sense a stored data stored in a memory cell array by using a plurality of reference levels to generate a plurality of read data, respectively, and output said plurality of read data with regard to said stored data; and
    a selector configured to select a data corresponding to any one of said plurality of read data based on a control signal and output said selected data as an output data,
    wherein said control signal is a mode signal indicating an operation mode of a semiconductor memory device provided with the data read-out circuit.

8. The semiconductor memory device according to claim 7,
    wherein said plurality of reference levels include a first reference level and a second reference level, and said plurality of read data include a first read data and a second read data obtained by using said first reference level and said second reference level, respectively,
    wherein said selector selects said first read data as said output data when said mode signal indicates a first operation mode, while said selector selects said second read data as said output data when said mode signal indicates a second operation mode.

9. The semiconductor memory device according to claim 8,
    wherein said semiconductor memory device is an electronically erasable and programmable read only memory,
    wherein an operation speed of said semiconductor memory device is higher in said first operation mode than in said second operation mode, and said first reference level is set to be lower than said second reference level.

10. The semiconductor memory device according to claim 8, wherein said sense amplifier circuit outputs said plurality of read data to said selector in parallel.

11. The semiconductor memory device according to claim 8, wherein said sense amplifier circuit outputs said plurality of read data sequentially to said selector.

12. A semiconductor memory device comprising a correction circuit, said correction circuit comprising:
an error correction code (ECC) circuit configured to receive a plurality of read data that are read out from a same memory cell group based on simultaneous comparison of data stored in said same memory cell group with a plurality of reference levels and detect respective numbers of error bits in said plurality of read data by using an error correction code associated with said data stored in said same memory cell group; and
a selector configured to select a data corresponding to one of said plurality of read data having a minimum number of error bits.

13. A semiconductor memory device comprising:
a data read-out circuit; and
a data determination unit
wherein said data read-out circuit comprises:
a sense amplifier circuit configured to sense a stored data stored in a memory cell array by using a plurality of reference levels to generate a plurality of read data, respectively, and output said plurality of read data with regard to said stored data; and
a selector configured to select a data corresponding to any one of said plurality of read data based on a control signal and output said selected data as an output data,
wherein if data determination by using one of said plurality of reference levels results in erroneous determination, said data determination unit makes the data determination by using another of said plurality of reference levels.

14. The semiconductor memory device according to claim 13, further comprising said memory cell array connected to said data read-out circuit.

* * * * *